(12) United States Patent
Hwang

(10) Patent No.: US 12,277,961 B2
(45) Date of Patent: Apr. 15, 2025

(54) SEMICONDUCTOR DEVICE

(71) Applicant: Samsung Electronics Co., Ltd., Suwon-si (KR)

(72) Inventor: Youngnam Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 56 days.

(21) Appl. No.: 18/371,696

(22) Filed: Sep. 22, 2023

(65) Prior Publication Data

US 2024/0257856 A1 Aug. 1, 2024

(30) Foreign Application Priority Data

Jan. 27, 2023 (KR) .................. 10-2023-0010667

(51) Int. Cl.
| | |
|---|---|
| G11C 11/22 | (2006.01) |
| G11C 5/06 | (2006.01) |
| H10B 51/10 | (2023.01) |
| H10B 51/20 | (2023.01) |
| H10B 51/40 | (2023.01) |

(52) U.S. Cl.
CPC .......... *G11C 11/2257* (2013.01); *G11C 5/063* (2013.01); *G11C 11/2255* (2013.01); *G11C 11/2273* (2013.01); *G11C 11/2275* (2013.01); *H10B 51/10* (2023.02); *H10B 51/20* (2023.02); *H10B 51/40* (2023.02)

(58) Field of Classification Search
None
See application file for complete search history.

(56) References Cited

U.S. PATENT DOCUMENTS

| | | | |
|---|---|---|---|
| 5,345,414 A | * | 9/1994 | Nakamura .............. G11C 11/22 |
| | | | 257/E27.104 |
| 7,236,387 B2 | | 6/2007 | Salling |
| 8,148,759 B2 | | 4/2012 | Wilson et al. |
| 10,367,004 B2 | | 7/2019 | Liu et al. |

(Continued)

FOREIGN PATENT DOCUMENTS

| | | |
|---|---|---|
| KR | 102388901 B1 | 4/2022 |
| KR | 102405521 B1 | 6/2022 |

OTHER PUBLICATIONS

Ankit Sharma and Kaushik Roy, "1T Non-Volatile Memory Design Using Sub-10nm Ferroelectric FETs," IEEE Electron Device Letters, vol. 39, No. 3, Mar. 2018.

*Primary Examiner* — Tan T. Nguyen
(74) *Attorney, Agent, or Firm* — Muir Patent Law, PLLC

(57) ABSTRACT

A semiconductor device includes memory cells connected to word lines, bit lines, and one source line, a row decoder connected to the word lines, and a sense amplifier circuit connected to the bit lines. In a program operation for two or more selected memory cells, a reference voltage is applied to the one source line, the sense amplifier circuit inputs a selected voltage to one selected bit line connected to the selected memory cells, and the row decoder inputs, to selected word lines connected to respective ones of the selected memory cells, a first program voltage lower than the reference voltage or a second program voltage higher than the reference voltage. Each of the memory cells includes a ferroelectric layer in which at least one of a polarization direction and a polarization degree changes depending on a voltage input to each of the word lines.

20 Claims, 18 Drawing Sheets

(56) References Cited

U.S. PATENT DOCUMENTS

| | | | |
|---|---|---|---|
| 11,037,614 B2 | 6/2021 | Liu et al. | |
| 11,195,087 B2 | 12/2021 | Lee | |
| 11,276,449 B2 | 3/2022 | Ramaswamy et al. | |
| 11,341,403 B2 | 5/2022 | Lee | |
| 11,461,620 B2 | 10/2022 | Obradovic et al. | |
| 11,763,870 B2 * | 9/2023 | Vimercati | G11C 11/2255 365/145 |
| 12,176,433 B2 * | 12/2024 | Chang | H01L 29/66969 |
| 2007/0236979 A1 * | 10/2007 | Takashima | H10B 53/30 257/E21.664 |
| 2011/0095272 A1 | 4/2011 | Ng et al. | |
| 2019/0019564 A1 | 1/2019 | Li et al. | |
| 2022/0020413 A1 | 1/2022 | Tang | |
| 2022/0215870 A1 | 7/2022 | Jung et al. | |
| 2023/0077181 A1 * | 3/2023 | Petti | H10B 41/27 |
| 2023/0282282 A1 * | 9/2023 | Harari | H01L 29/792 257/314 |
| 2024/0347109 A1 * | 10/2024 | Yoshihara | G11C 5/063 |
| 2024/0404598 A1 * | 12/2024 | Hsu | G11C 16/26 |

* cited by examiner

SEMICONDUCTOR DEVICE

CROSS-REFERENCE TO RELATED APPLICATION

This application claims benefit of priority under 35 U.S.C. § 119 to Korean Patent Application No. 10-2023-0010667 filed on Jan. 27, 2023 in the Korean Intellectual Property Office, the disclosure of which is incorporated herein by reference in its entirety.

BACKGROUND

The present inventive concept relates to a semiconductor device.

Ferroelectrics are materials having ferroelectricity that maintain polarization in a direction of alignment of internal electric dipoles in the absence of an external electric field. Research has been conducted to apply such ferroelectricity to semiconductor devices for various purposes.

SUMMARY

An aspect of the present inventive concept provides a semiconductor device including a plurality of memory cells capable of recording data by adjusting a direction of alignment of electric dipoles formed within a ferroelectric layer, the semiconductor device capable of executing an efficient program operation without disturbance and effectively executing an arithmetic operation based on a neural network.

In accordance with an aspect of the disclosure, a semiconductor device includes a cell region in which a plurality of memory cells are disposed in a first direction and a second direction, the first direction and the second direction being parallel to an upper surface of a substrate and intersecting each other, wherein each of the plurality of memory cells includes a first active region and a second active region arranged in the first direction, a channel layer connected to the first active region and the second active region, and a ferroelectric layer and a gate electrode layer surrounding the channel layer; and a peripheral circuit region in which are disposed a plurality of sense amplifiers connected to the plurality of memory cells via a plurality of bit lines, a row decoder connected to the plurality of memory cells via a plurality of word lines, and a control logic controlling the plurality of sense amplifiers and the row decoder, wherein, in two or more memory cells stacked in a third direction perpendicular to the upper surface of the substrate, the first active regions of the two or more memory cells are connected to each other and the second active regions of the two or more memory cells are connected to each other, and the first active region in each of the plurality of memory cells receives a reference voltage in common with each other of the plurality of memory cells, the second active region in each of the plurality of memory cells is connected to one of the plurality of bit lines, and the gate electrode layer in each of the plurality of memory cells is connected to one of the plurality of word lines.

In accordance with an aspect of the disclosure, a semiconductor device includes a plurality of memory cells connected to a plurality of word lines, a plurality of bit lines, and one source line; a row decoder connected to the plurality of word lines; and a sense amplifier circuit connected to the plurality of bit lines, wherein, in a program operation for two or more selected memory cells among the plurality of memory cells, a reference voltage is applied to the one source line, the sense amplifier circuit inputs a selected voltage to one selected bit line connected to all of the two or more selected memory cells, and the row decoder inputs, to selected word lines connected to respective ones of the two or more selected memory cells, a first program voltage lower than the reference voltage or a second program voltage higher than the reference voltage, and each of the plurality of memory cells includes a ferroelectric layer in which at least one of a polarization direction and a polarization degree changes depending on a voltage input to each of the plurality of word lines.

In accordance with an aspect of the disclosure, A semiconductor device includes a plurality of memory cells connected to a plurality of word lines, a plurality of bit lines, and one source line; a row decoder connected to the plurality of word lines; a sense amplifier circuit connected to the plurality of bit lines; and a control logic configured to control the row decoder and the sense amplifier circuit, wherein, in a read operation for two or more selected memory cells among the plurality of memory cells, a reference voltage is applied to the source line, the sense amplifier circuit inputs a predetermined bias voltage to selected bit lines connected to all of the two or more selected memory cells, and the row decoder inputs a read voltage higher than the reference voltage to at least one selected word line connected to the two or more selected memory cells, the control logic executes the read operation based on a voltage change of each of the selected bit lines sensed by the sense amplifier circuit, and each of the plurality of memory cells includes a ferroelectric layer in which at least one of a polarization direction and a polarization degree changes depending on a voltage input to each of the plurality of word lines.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, preferred example embodiments of the present inventive concept will be described with reference to the accompanying drawings.

Figure 1:
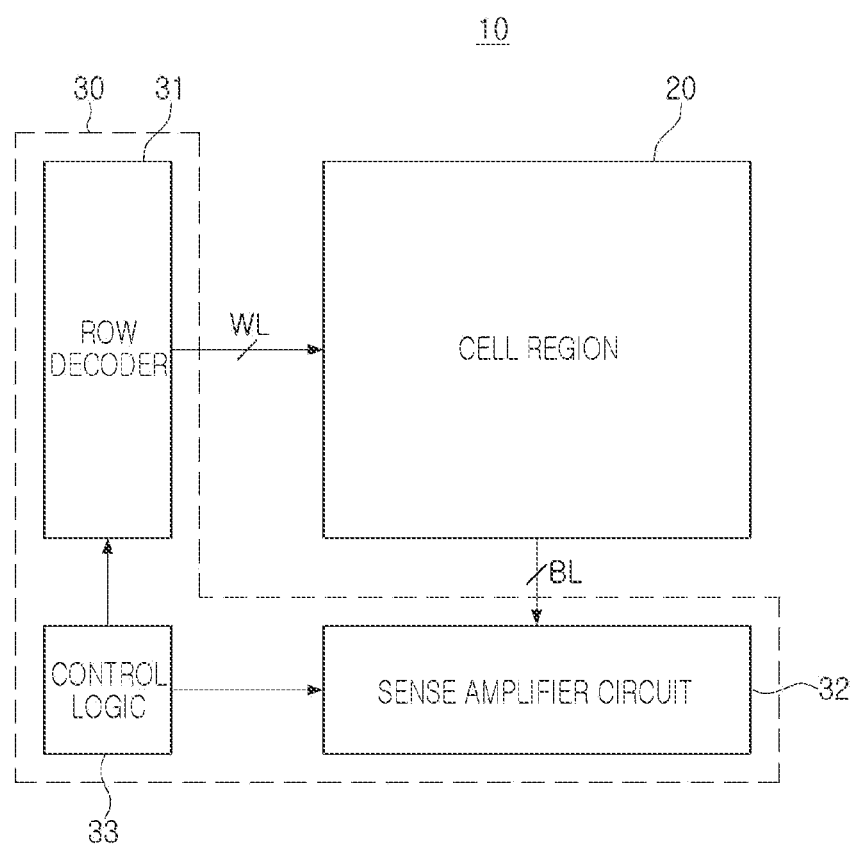
FIGS. 1 and 2 are schematic diagrams illustrating a semiconductor device according to an example embodiment of the present inventive concept.
Figure 2:
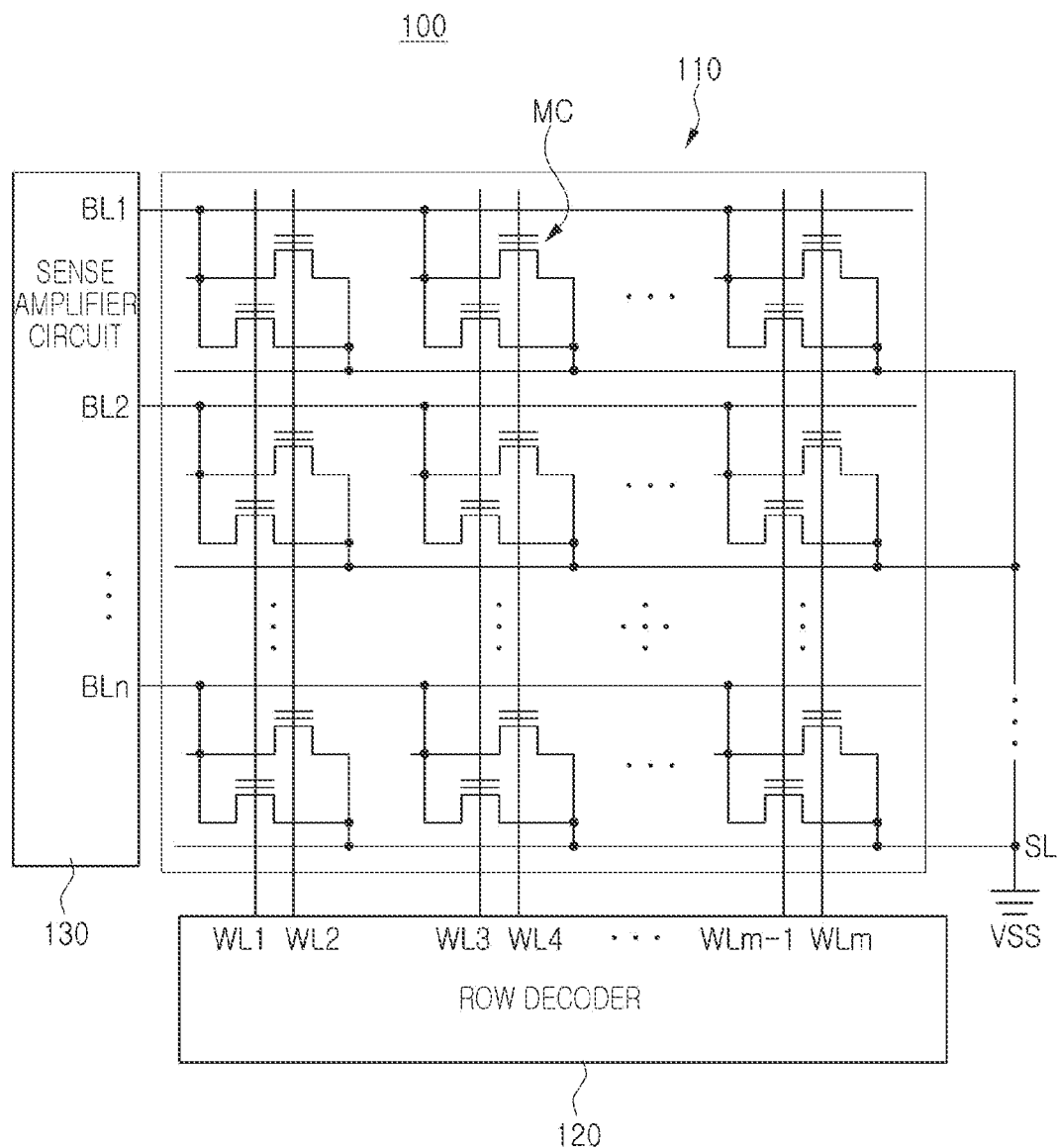

FIGS. 1 and 2 are schematic diagrams illustrating a semiconductor device according to an example embodiment of the present inventive concept.

Referring to FIG. 1, a semiconductor device 10 according to an example embodiment may include a cell region 20 and a peripheral circuit region 30. A plurality of memory cells may be disposed in the cell region 20. The plurality of memory cells may be connected to a row decoder 31 via a plurality of word lines WL, and may be connected to a sense amplifier circuit 32 via a plurality of bit lines BL. For example, the sense amplifier circuit 32 may include a plurality of sense amplifiers, and the plurality of sense amplifiers may be respectively connected to the plurality of bit lines BL.

Each of the plurality of memory cells may be implemented as a single device. In an example embodiment, each of the plurality of memory cells may include a first active region, a second active region, a channel layer between the first active region and the second active region, a ferroelectric layer and a gate electrode layer surrounding the channel layer, and the like. The ferroelectric layer may include a ferroelectric material, and a polarization direction and a polarization degree of the ferroelectric layer may be changed by one or more voltages input to the first active region, the second active region, and the gate electrode layer. As described above, in an example embodiment of the present inventive concept, a threshold voltage of the memory cell may be changed by adjusting the polarization direction and the polarization degree of the ferroelectric layer included in the memory cell, thereby storing data in the memory cell.

In the cell region 20, a plurality of memory cells may be arranged in the form of a cell array. Two or more memory cells may be respectively connected to the plurality of word lines WL, and two or more memory cells may be respectively connected to the plurality of bit lines BL. For example, each of the plurality of bit lines BL may extend in a first direction, and may be connected to a portion of the plurality of memory cells. The plurality of word lines WL may be respectively connected to gate electrode layers extending in a second direction, intersecting the first direction. Accordingly, each of the plurality of memory cells may be disposed at a respective position in which a respective one of the plurality of word lines WL and a respective one of the plurality of bit lines BL intersect each other.

The peripheral circuit region 30 may include the row decoder 31, the sense amplifier circuit 32, a control logic 33, and the like. The control logic 33 may control the row decoder 31 and the sense amplifier circuit 32 in response to a command received from an external memory controller. For example, a voltage input by the row decoder 31 to each of the plurality of word lines WL and a voltage input by the sense amplifier circuit 32 to each of the plurality of bit lines BL may be changed by the control logic 33, and accordingly, a program operation, a read operation, and the like may be executed.

Referring to FIG. 2, a memory device 100 according to an example embodiment of the present inventive concept may include a memory cell array 110 in which a plurality of memory cells MC are disposed, a row decoder 120, a sense amplifier circuit 130, and the like. As described above, the plurality of memory cells MC may be connected to the sense amplifier circuit 130 via a plurality of bit lines BL1 to BLn, and may be connected to the row decoder 120 via a plurality of word lines WL1 to WLm.

In an example embodiment illustrated in FIG. 2, a portion of the plurality of memory cells MC may be connected to one of the plurality of bit lines BL1 to BLn in common. In addition, all of the plurality of memory cells MC may be connected to one source line SL in common, and a reference voltage VSS may be input to the source line SL. For example, the reference voltage VSS may be a ground voltage.

As described above, each of the plurality of memory cells MC may include a first active region, a second active region, a channel layer, a ferroelectric layer, and a gate electrode layer. The gate electrode layer of each of the plurality of memory cells MC may be connected to one of the plurality of word lines WL1 to WLm. The first active region may be connected to the source line SL, and the second active region may be connected to one of the plurality of bit lines BL1 to BLn. Referring to FIG. 2, a second active region included in each of two or more memory cells MC may be connected to one of the plurality of bit lines BL1 to BLn in common. However, each of the two or more memory cells MC sharing one of the plurality of bit lines BL1 to BLn may be connected to different word lines WL1 to WLm, and thus may be independently controlled.

Figure 3:
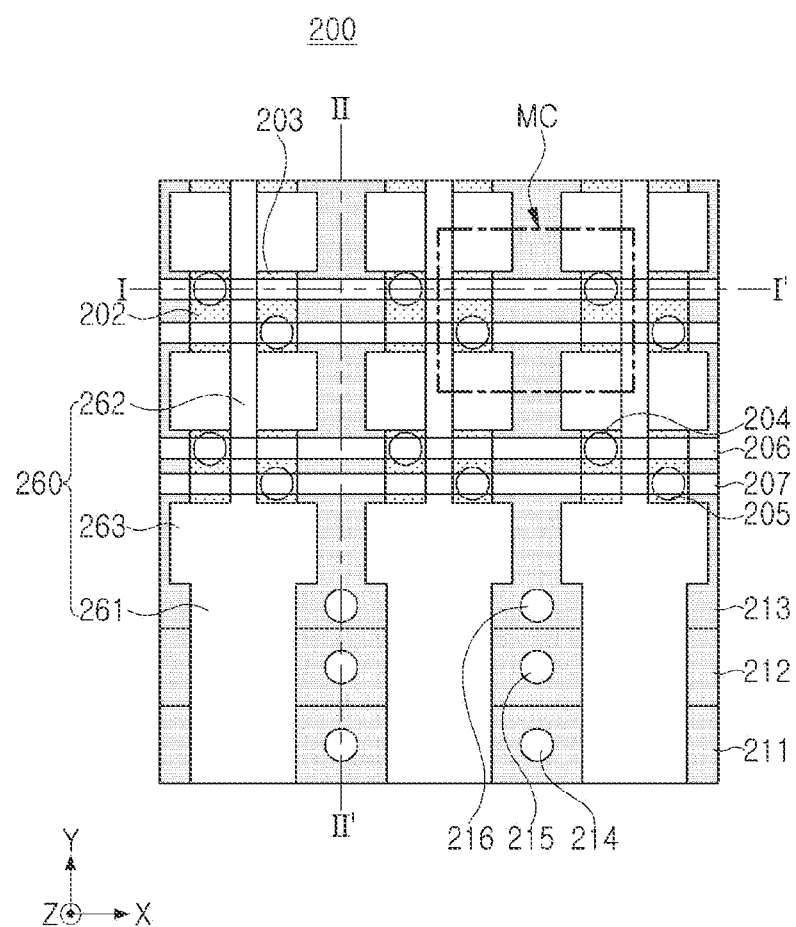
FIGS. 3 to 5 are schematic diagrams illustrating a semiconductor device according to an example embodiment of the present inventive concept.
Figure 4:
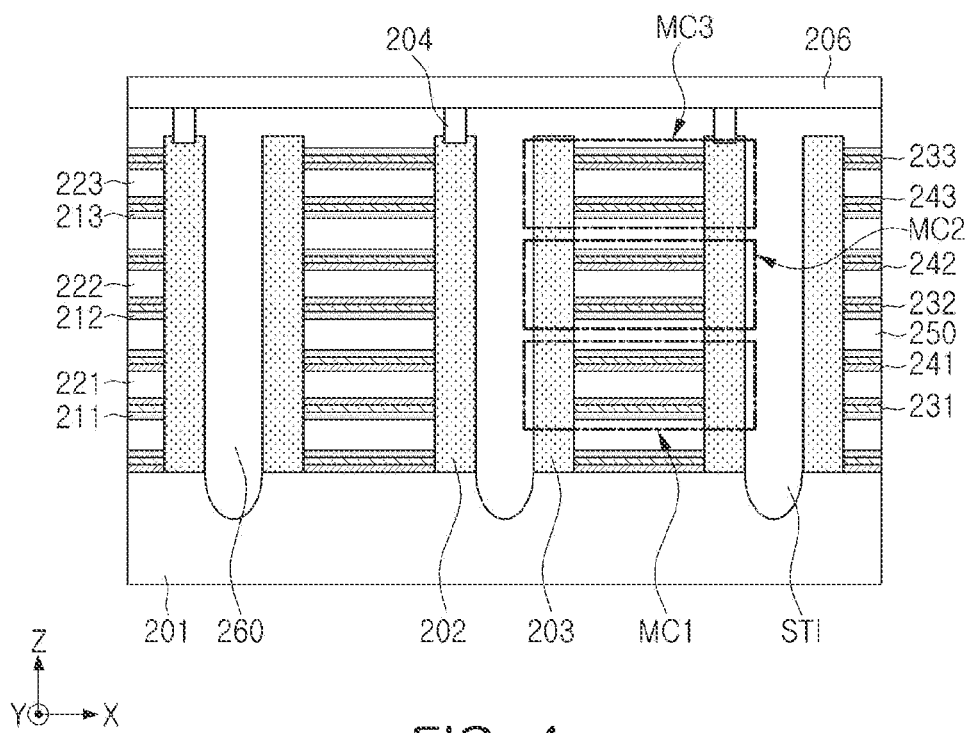
Figure 5:
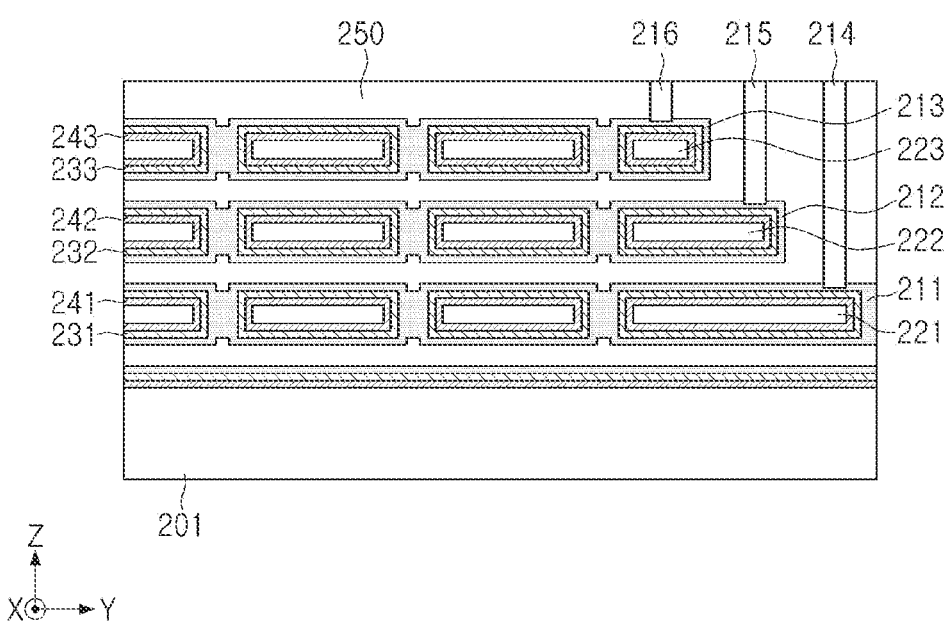

FIGS. 3 to 5 are schematic diagrams illustrating a semiconductor device according to an example embodiment of the present inventive concept.

FIG. 3 may be a schematic plan view of a partial region of a semiconductor device 200 according to an example embodiment. FIG. 4 may be a cross-sectional view of a cross-section of FIG. 3 in a direction I-I'. FIG. 5 may be a cross-sectional view of a cross-section of FIG. 3 in a direction II-II'. FIGS. 3 to 5 may be diagrams illustrating a portion of a cell region of the semiconductor device 200 in which a plurality of memory cells MC are disposed.

Referring to FIGS. 3 to 5, in the semiconductor device 200 according to an example embodiment of the present inventive concept, the plurality of memory cells MC may be arranged in a first direction (X-axis direction) and a second direction (Y-axis direction), parallel to an upper surface of a substrate 201. Each of the plurality of memory cells MC may include a first active region 202 and a second active region 203 adjacent to each other in the first direction, a plurality of channel layers 221 to 223 extending in the first direction between the first active region 202 and the second active region 203, a plurality of ferroelectric layers 231 to 233, and a plurality of gate electrode layers 211. The plurality of ferroelectric layers 231 to 233 and the plurality of gate electrode layers 211 may be sequentially disposed on the plurality of channel layers 221 to 223. In addition, a plurality of gate insulating layers 241 to 243 may be disposed between the plurality of channel layers 221 to 223 and the plurality of ferroelectric layers 231 to 233.

In an example embodiment illustrated in FIGS. 3 to 5, each of the plurality of memory cells MC may include a first channel layer 221, a second channel layer 222, and a third channel layer 223 isolated from each other in a third direction (Z-axis direction), perpendicular to the upper surface of the substrate 201. However, the number of channel layers 221 to 223 connected between the first active region 202 and the second active region 203 is not limited to that illustrated in FIGS. 3 to 5. In some example embodiments, the number of channel layers 221 to 223 may vary. For example, each of the plurality of memory cells MC may include only two channel layers or four or more channel layers. An interlayer insulating layer 250 may be disposed between adjacent ones of the plurality of channel layers 221 to 223 in the third direction, and the interlayer insulating layer 250 may be formed of an insulating material such as silicon oxide, silicon nitride, silicon oxynitride, or the like.

For example, the first channel layer 221 may include a semiconductor material and opposite sides of the first channel layer 221 in the first direction may be connected to the first active region 202 and the second active region 203. A first ferroelectric layer 231 and a first gate electrode layer 211 may be sequentially disposed on the first channel layer 221. For example, the first ferroelectric layer 231 may include a ferroelectric material such as hafnium (Hf), zirconium (Zr), silicon (Si), yttrium (Y), aluminum (Al), gadolinium (Gd), strontium (Sr), lanthanum (La), scandium (Sc), and oxides thereof. A first gate insulating layer 241 may be disposed between the first ferroelectric layer 231 and the first channel layer 221, and the first gate insulating layer may be formed of silicon oxide or the like.

Referring to FIGS. 4 and 5, the first channel layer 221 may extend in the first direction, such that opposite sides of the first channel layer 221 may be connected to the first active region 202 and the second active region 203, and at the same time, the first channel layer 221 may extend in the second direction. In addition, as illustrated in FIG. 5, the first channel layer 221 may be surrounded in the second direction and the third direction by the first gate insulating layer 241, the first ferroelectric layer 231, and the first gate electrode layer 211.

The plurality of memory cells MC may be arranged in a three-dimensional form in the first to third directions. The first channel layer 221, included in each of the memory cells MC adjacent to each other in the second direction, may be isolated from each other, as illustrated in FIG. 5. The memory cells MC disposed at the same position in the first direction and at the same height in the third direction may share the first gate electrode layer 211 in the second direction, as illustrated in FIG. 5.

Structures of the second channel layer 222 and the third channel layer 223 and surroundings thereof may be similar to those described above. For example, the second channel layer 222 may be surrounded in the second direction and the third direction by a second gate insulating layer 242, a second ferroelectric layer 232, and a second gate electrode layer 212 sequentially disposed. The second channel layers 222, disposed at the same position in the first direction and at the same height in the third direction, may be isolated from each other, and one second gate electrode layer 212 may surround the second channel layers 222 that are adjacent to each other in the second direction.

As illustrated in FIG. 4, two or more memory cells MC, disposed at the same position in the first direction and the second direction and disposed at different heights in the third direction, may share the first active region 202 and the second active region 203. In other words, two or more memory cells MC may be connected to each other in parallel between the first active region 202 and the second active region 203. However, in two or more memory cells MC sharing the first active region 202 and the second active region 203, the gate electrode layers 211 to 213 may be isolated from each other, and may independently receive different levels of voltages from a row decoder. Accordingly, the two or more memory cells MC, sharing the first active region 202 and the second active region 203, may be programmed to store different data pieces.

For example, a first program voltage may be input to the first gate electrode layer 211 and a predetermined level of voltage may be input to each of the first active region 202 and the second active region 203, thereby changing a polarization state of the first ferroelectric layer 231 and reducing a threshold voltage of a first memory cell MC1 including the first gate electrode layer 211. In this case, a polarization state of the second ferroelectric layer 232 may be adjusted to be different from that of the first ferroelectric layer 231 by inputting a second program voltage different from the first program voltage to the second gate electrode layer 212. Accordingly, a threshold voltage of the second memory cell MC2 may have a value different from that of the first memory cell MC1. In an example embodiment of the present inventive concept, the first program voltage or the second program voltage may be input to each of the gate electrode layers 211 to 213, included in memory cells MC1 to MC3 sharing the first active region 202 and the second active region 203, thereby independently programming the memory cells MC1 to MC3 at the same time.

Referring to FIGS. 3 and 4, the first active region 202 may be connected to one of a plurality of source lines 206 via a source line contact 204, and the second active region 203 may be connected to one of a plurality of bit lines 207 via a bit line contact 205. The plurality of source lines 206 and the plurality of bit lines 207 may extend in the first direction.

The plurality of source lines 206 may be connected to each other to receive a reference voltage, and the plurality of bit lines 207 may be connected to a sense amplifier circuit. For example, the plurality of source lines 206 may receive a ground voltage. As described above, the sense amplifier circuit may include a plurality of sense amplifiers, and each of the plurality of sense amplifiers may be connected to a respective one of the plurality of bit lines 206.

The source line contact 204 and the bit line contact 205 may be disposed at different positions in the second direction such that one of the source line contact 204 and the bit line contact 205 is disposed on the first active region 202 and the other one of the source line contact 204 and the bit line contact 205 is disposed on the second active region 203. In an example embodiment illustrated in FIG. 3, the source line contact 204 may be disposed above the bit line contact 205 in the second direction (e.g., farther forward in the second direction (Y direction) as shown in FIG. 3) in each of the memory cells MC. Accordingly, the plurality of source lines 206 and the plurality of bit lines 207 may be alternately disposed in the second direction without interference.

A plurality of gate electrode layers 211 to 213 may be defined as a plurality of word lines extending in the second direction. The plurality of gate electrode layers 211 to 213 may be connected to a row decoder via a plurality of gate contacts 214 to 216. The row decoder may adjust a level of a voltage input to at least a portion of the plurality of gate electrode layers 211 to 213 in a control operation such as a program operation, a read operation, or the like.

The semiconductor device 200 may include a vertical insulating layer 260. For example, the vertical insulating layer 260 may include a first vertical insulating layer 261, a second vertical insulating layer 262, and a third vertical insulating layer 263, and each of the first to third vertical insulating layers 261 to 263 may have different widths in the first direction (see, e.g., FIG. 3). For example, the second vertical insulating layer 262 may have a narrowest width and the third vertical insulating layer 263 may have a widest width. The vertical insulating layer 260 may be formed of at least one of silicon oxide, silicon nitride, and silicon oxynitride, and may be formed of, for example, a material the same as that of the interlayer insulating layer 250. The second vertical insulating layer 262 may be an active insulating layer isolating, from each other, active regions 202 and 203 adjacent to each other in the second direction.

Referring to FIG. 3, the first vertical insulating layer 261 may be adjacent to the gate contacts 214 to 216 in the first direction, and may isolate, from each other, the gate electrode layers 211 to 213 and the channel layers 221 to 223 in the first direction. The second vertical insulating layer 262 may be included in different memory cells MC, and may be disposed between the first active region 202 and the second active region 203 adjacent in the first direction. The third vertical insulating layer 263 may be disposed between the first vertical insulating layer 261 and the second vertical insulating layer 262 in the second direction. For example, a boundary between memory cells MC adjacent to each other in the first direction may be determined by the second vertical insulating layer 262, and a boundary between memory cells MC adjacent to each other in the second direction may be determined by the third vertical insulating layer 263. A partial region of the second vertical insulating layer 262 may be formed to recess at least a portion of the substrate 201 to provide an isolation insulating film STI (see, e.g., FIG. 4).

As described above, in an example embodiment of the present inventive concept, a threshold voltage of each of two or more memory cells MC1 to MC3, disposed at the same position in the first direction and the second direction and sharing the active regions 202 and 203, may be individually adjusted. Accordingly, the two or more memory cells MC1 to MC3 may be individually programmed at the same time.

In a read operation of the semiconductor device 200 according to an example embodiment of the present inventive concept, data may be read at the same time from the memory cells MC disposed at the same position in the first direction and the third direction and sharing one of the gate electrode layers 211 to 213. In addition, input voltages corresponding to predetermined input data may be input to the gate electrode layers 211 to 213, and a read operation may be executed via one of the plurality of bit lines 206, thereby executing a multiply-accumulate (MAC) operation included in an inference operation of a neural network. A detailed operation of the semiconductor device 200 will be described below.

Figure 6:
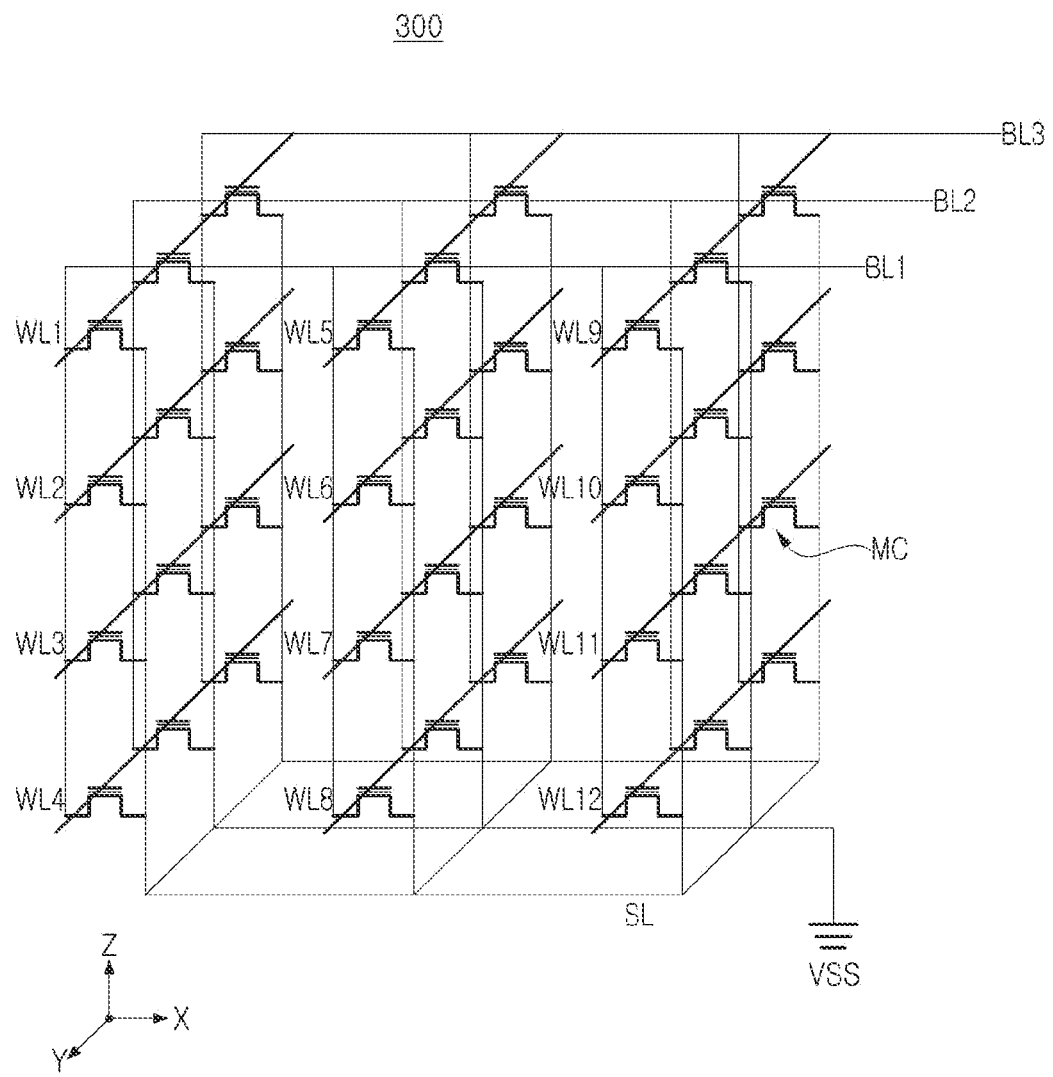
FIG. 6 is a schematic diagram illustrating a memory cell array of a semiconductor device according to an example embodiment of the present inventive concept.

FIG. 6 is a schematic diagram illustrating a memory cell array of a semiconductor device according to an example embodiment of the present inventive concept.

Referring to FIG. 6, a memory cell array of a semiconductor device 300 according to an example embodiment of the present inventive concept may include a plurality of word lines WL1 to WL12, a plurality of bit lines BL1 to BL3, and a source line SL. Each of the plurality of memory cells MC may be implemented as one memory device in which a ferroelectric layer is disposed between a gate electrode layer and a channel layer. In each of the plurality of memory cells MC, a first active region may be connected to the source line SL, a second active region may be connected to one of the plurality of bit lines BL1 to BL3, and a gate electrode layer may be connected to one of the plurality of word lines WL1 to WL12.

The plurality of word lines WL1 to WL12 and the plurality of bit lines BL1 to BL3 may extend in a direction in which the plurality of word lines WL1 to WL12 and the plurality of bit lines BL1 to BL3 cross each other. For example, the plurality of bit lines BL1 to BL3 may extend in a first direction (X-axis direction), and the plurality of word lines WL1 to WL12 may extend in a second direction (Y-axis direction). A plurality of memory cells MC may be respectively disposed at points at which the plurality of bit lines BL1 to BL3 and the plurality of word lines WL1 to WL12 intersect each other, and at least a portion of the plurality of memory cells MC may be stacked in a third direction (Z-axis direction).

For example, the third direction may be a direction perpendicular to an upper surface of a substrate on which a plurality of memory cells MC are formed. In an example embodiment described above with reference to FIGS. 3 to 5, it is described that three memory cells MC may be stacked in a direction perpendicular to the upper surface of the substrate. However, in an example embodiment illustrated in FIG. 6, four memory cells MC may be stacked in the third direction. The four memory cells MC, stacked in the third direction, may all be connected to the same one of the plurality of bit lines BL1 to BL3 in common. Two or more memory cells MC, disposed at specific positions in the first direction and the third direction, may all be connected to the same one of the plurality of word lines WL1 to WL12 in common.

As illustrated in FIG. 6, the plurality of memory cells MC included in the memory cell array may all be connected to one source line SL in common, and a reference voltage VSS may be input to the source line SL. The reference voltage VSS may be input to the source line SL by a row decoder or sense amplifier circuit, and may have, for example, a ground level. The plurality of memory cells MC may be connected to the source line SL in common as described above, thereby reducing a level of difficulty of forming the plurality of memory cells MC in the memory cell array. In an example embodiment, the source line SL may be implemented as a mesh-type interconnection pattern extending in the first direction and the second direction. When the reference voltage VSS is on a ground level, the semiconductor device 300 may have improved ground quality.

Various control operations, such as a program operation, a read operation, a MAC operation, and the like using the plurality of memory cells MC, may be executed by adjusting a level of a voltage input to the plurality of word lines WL1 to WL12 and the plurality of bit lines BL1 to BL3. In other words, the reference voltage VSS may be input to the source line SL regardless of whether a control operation is executed, and regardless of a type of the control operation executed. A circuit for inputting a voltage other than the reference voltage VSS may not be connected to the source line SL, thereby simplifying a structure of the semiconductor device 300.

Figure 7:
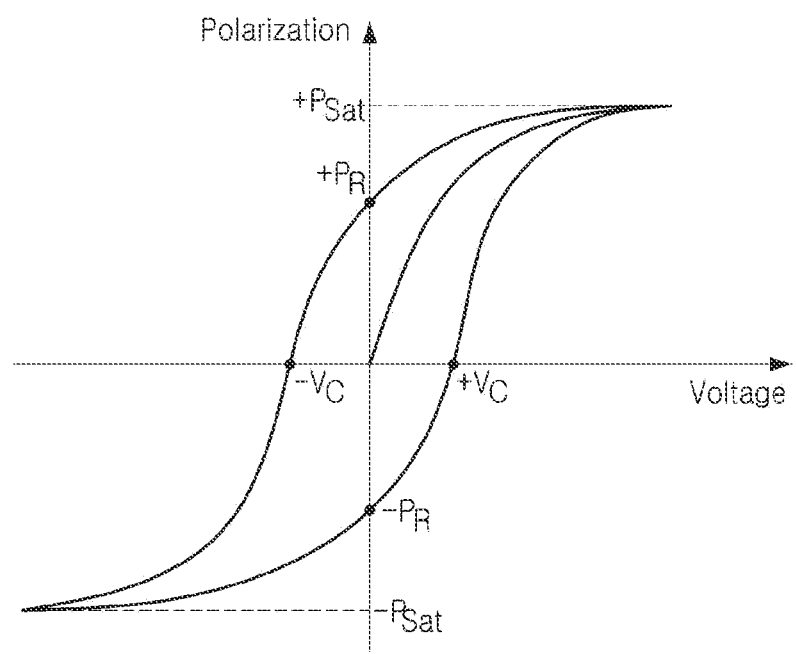
FIG. 7 is a diagram illustrating an operation of a semiconductor device according to an example embodiment of the present inventive concept.

FIG. 7 is a diagram illustrating an operation of a semiconductor device according to an example embodiment of the present inventive concept.

FIG. 7 is a graph illustrating a hysteresis curve of a ferroelectric material included in a ferroelectric layer of a memory cell in a semiconductor device according to an example embodiment of the present inventive concept. Referring to FIG. 7, when no voltage is input to a gate electrode layer and no electric field is applied to a ferroelectric layer, polarization may not occur.

For example, when a voltage input to the gate electrode layer increases, a polarization degree of the ferroelectric layer may increase from 0 to a positive maximum point ($+P_{sat}$), which is a saturation polarization point within a positive polarization region. Thereafter, even when the voltage input to the gate electrode layer is blocked, the polarization degree may remain at a positive remanent point $(+P_R)$ defined as a remanent polarization point, without decreasing back to 0.

When the voltage input to the gate electrode layer decreases, the polarization degree may move to a minimum point $(-P_{sat})$ within a negative polarization region. In this case, the ferroelectric material included in the ferroelectric layer 231 may be polarized in a direction, opposite to a polarization direction at the positive maximum point $(+P_{sat})$. Thereafter, even when a negative voltage input to the gate electrode layer is blocked, the polarization degree may remain at a negative remanent point $(-P_R)$, without decreasing back to 0.

As described above, in order to change a polarization direction of the ferroelectric layer, a voltage may need to be applied in an opposite direction, and the voltage may be defined as a coercive voltage $(+V_C, -V_C)$ illustrated in FIG. 7. For example, the coercive voltage $(+V_C, -V_C)$ may be proportional to a thickness of the ferroelectric layer and a coercive field of the ferroelectric material.

For example, in a semiconductor device according to an example embodiment of the present inventive concept, a row decoder, connected to a gate electrode layer of each of a plurality of memory cells via a plurality of word lines, may input, to the plurality of word lines, a program voltage determined from the coercive voltage $(+V_C, -V_C)$, thereby executing a program operation of storing data in the plurality of memory cells. For example, the program voltage may include a first program voltage (a negative voltage) and a second program voltage (a positive voltage). An absolute value of the first program voltage and an absolute value of the second program voltage may be equal to each other.

Figure 8:
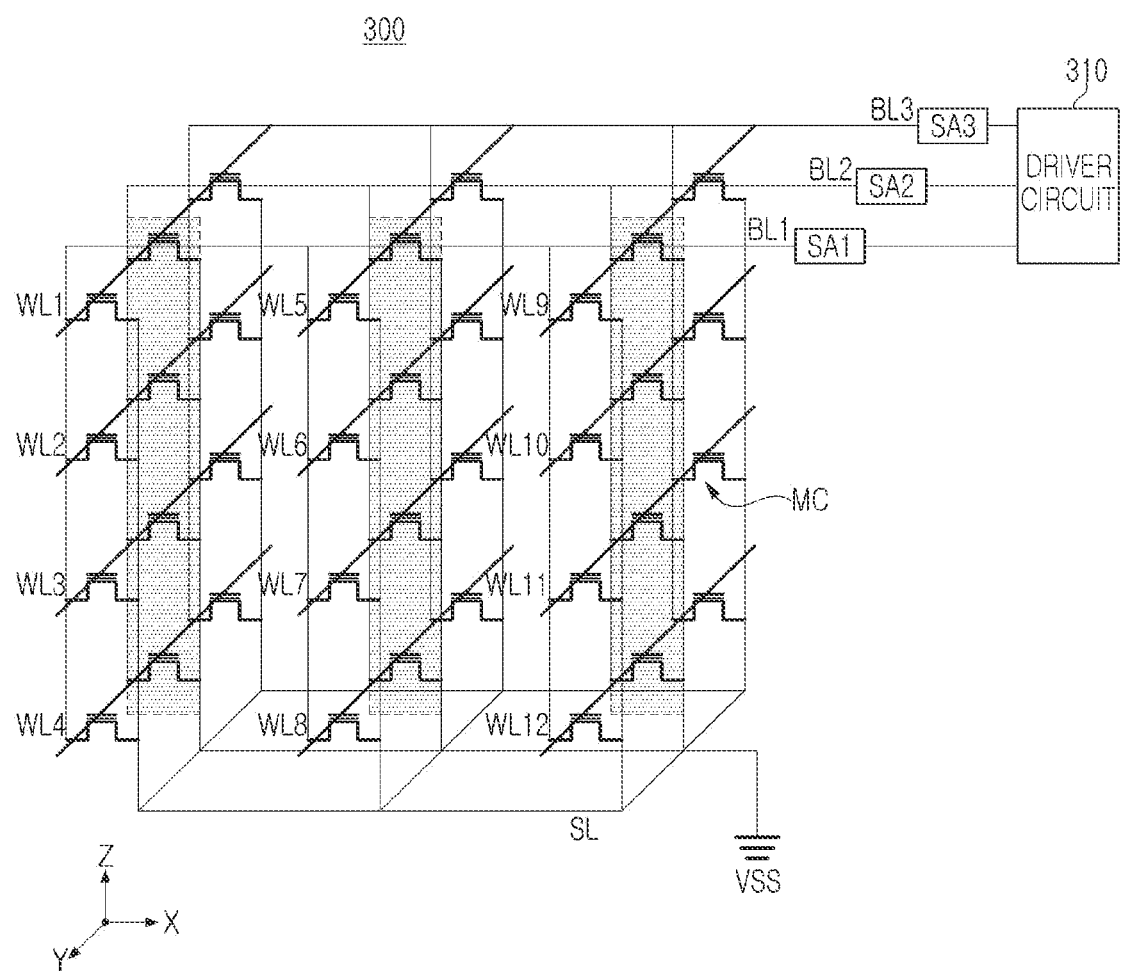
FIGS. 8 and 9 are diagrams illustrating a program operation of a semiconductor device according to an example embodiment of the present inventive concept.
Figure 9:
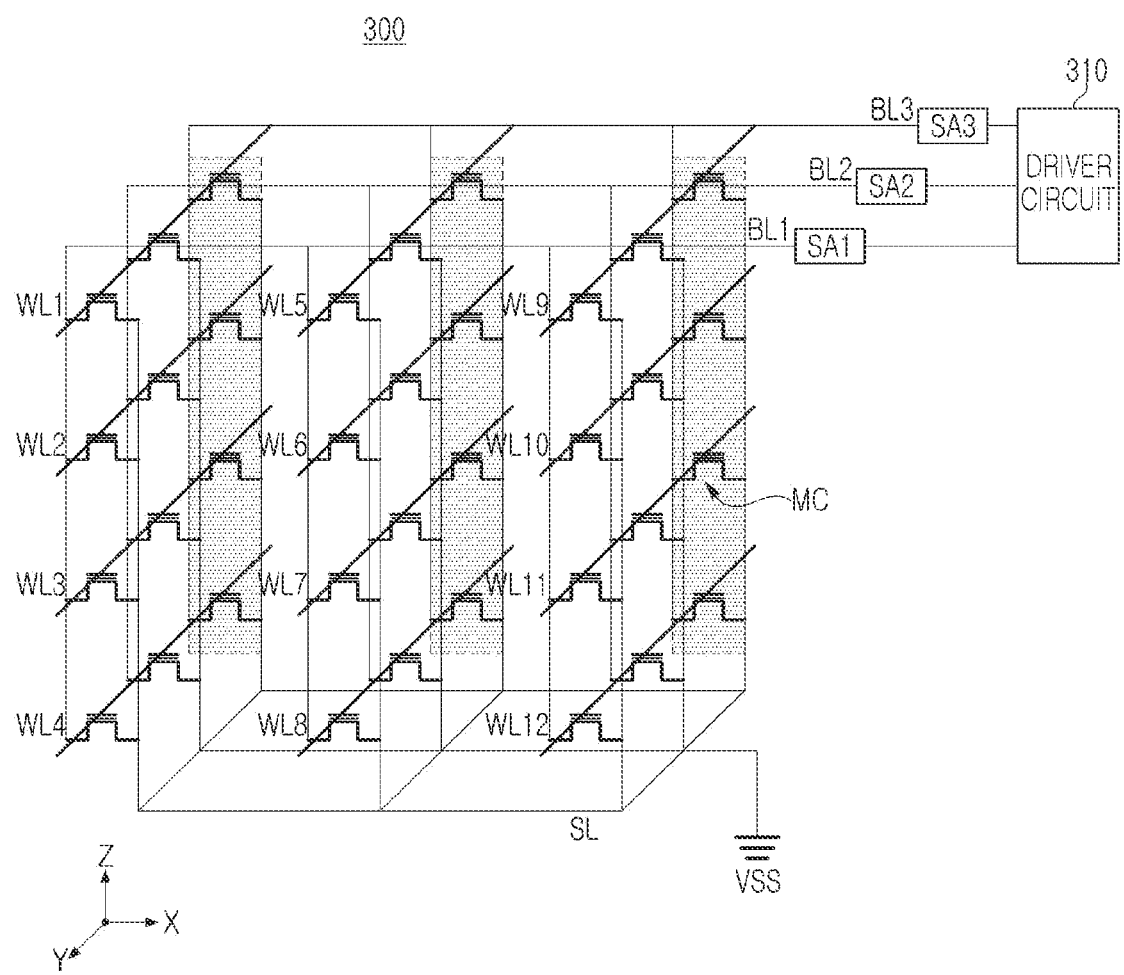

FIGS. 8 and 9 are diagrams illustrating a program operation of a semiconductor device according to an example embodiment of the present inventive concept.

In example embodiments described with reference to FIGS. 8 and 9, a plurality of memory cells MC, included in a semiconductor device 300, may form a memory cell array having the structure described above with reference to FIG. 6. In the semiconductor device 300, the memory cell array may be disposed in a cell region. The semiconductor device 300 may include a plurality of sense amplifiers SA1 to SA3 connected to a plurality of bit lines BL1 to BL3, a driver circuit 310 connected to the plurality of sense amplifiers SA1 to SA3, and the like. The plurality of sense amplifiers SA1 to SA3 may be included in a sense amplifier circuit, and may be disposed in a peripheral circuit region, together with the driver circuit 310 and a row decoder connected to a plurality of word lines WL1 to WL12. For example, a control logic controlling the row decoder, the sense amplifier circuit, and the driver circuit 310 may be disposed in the peripheral circuit region.

In an example embodiment described first with reference to FIG. 8, the control logic may determine a second bit line BL2 as a selected bit line. The control logic may control the plurality of sense amplifiers SA1 to SA3 and the driver circuit 310 such that a predetermined level of selected voltage is input to the second bit line BL2 and a reference voltage VSS is input to first and third bit lines BL1 and BL3 (unselected bit lines). Accordingly, a voltage having a level the same as that of the source line SL may be input to the unselected bit lines.

The row decoder may input a first program voltage or a second program voltage to each of the plurality of word lines WL1 to WL12 in response to control of the control logic. As described above, the first program voltage may be a negative voltage, and the second program voltage may be a positive voltage. For example, a word line voltage input to each of the plurality of word lines WL1 to WL12 and program data stored in those of twelve memory cells MC that are connected to the second bit line BL2 may be matched with each other, as indicated in Table 1 below.

TABLE 1

| Word line | Word line voltage | Program data |
| --- | --- | --- |
| WL1 | First program voltage | 1 |
| WL2 | First program voltage | 1 |
| WL3 | Second program voltage | 0 |
| WL4 | First program voltage | 1 |
| WL5 | Second program voltage | 0 |
| WL6 | Second program voltage | 0 |
| WL7 | First program voltage | 1 |
| WL8 | Second program voltage | 0 |
| WL9 | First program voltage | 1 |
| WL10 | Second program voltage | 0 |
| WL11 | First program voltage | 1 |
| WL12 | Second program voltage | 0 |

In the example indicated in Table 1, data "1" may be stored in the memory cells MC to which the first program voltage, a negative voltage, is input, and data "0" may be stored in the memory cells MC to which the second program voltage, a positive voltage, is input. However, in some example embodiments, it may be defined that the data "0" is stored in the memory cells MC to which the first program voltage is input, and the data "1" is stored in the memory cells MC to which the second program voltage is input.

For example, a selected voltage having a level of 1 V or less may be input to the second bit line BL2, a selected bit line. The first program voltage may be a negative voltage having an absolute value of 0.5 V or less, and the second program voltage may be a positive voltage having an absolute value of 0.5 V or less. In an example embodiment, an absolute value of each of the first program voltage and the second program voltage may be 0.2 V to 0.3 V.

The reference voltage VSS may be input to the first and third bit lines BL1 and BL3, unselected bit lines, such that a voltage difference between a drain terminal and a source terminal of each of unselected memory cells connected to the first and third bit lines BL1 and BL3 may be less than a voltage difference between a drain terminal and a source terminal of each of selected memory cells connected to the second bit line BL2. In this state, an absolute value of a coercive voltage of each of the unselected memory cells may be greater than an absolute value of a coercive voltage of each of the selected memory cells.

When a first program voltage or a second program voltage, having an absolute value less than the absolute value of the coercive voltage of each of the unselected memory cells and greater than the absolute value of the coercive voltage of each of the selected memory cells, is input to each of the plurality of word lines WL1 to WL12 connected to the selected memory cells, a threshold voltage of each of the selected memory cells may be changed. As described above, according to an example embodiment of the present inventive concept, a program operation for two or more selected memory cells may be executed without disturbing the unselected memory cells.

In an example embodiment illustrated in FIG. 9, the control logic may determine the third bit line BL3 as a selected bit line, and other operations may be similar to those described with reference to FIG. 8. A third sense amplifier SA3 may input a selected voltage to the third bit line BL3, and first and second sense amplifiers SA1 and SA2 may input a reference voltage VSS to the first and second bit lines BL1 and BL2. Voltages input to the plurality of word lines WL1 to WL12 by the row decoder may be determined depending on data to be stored in selected memory cells connected to the third bit line BL3.

Figure 10:
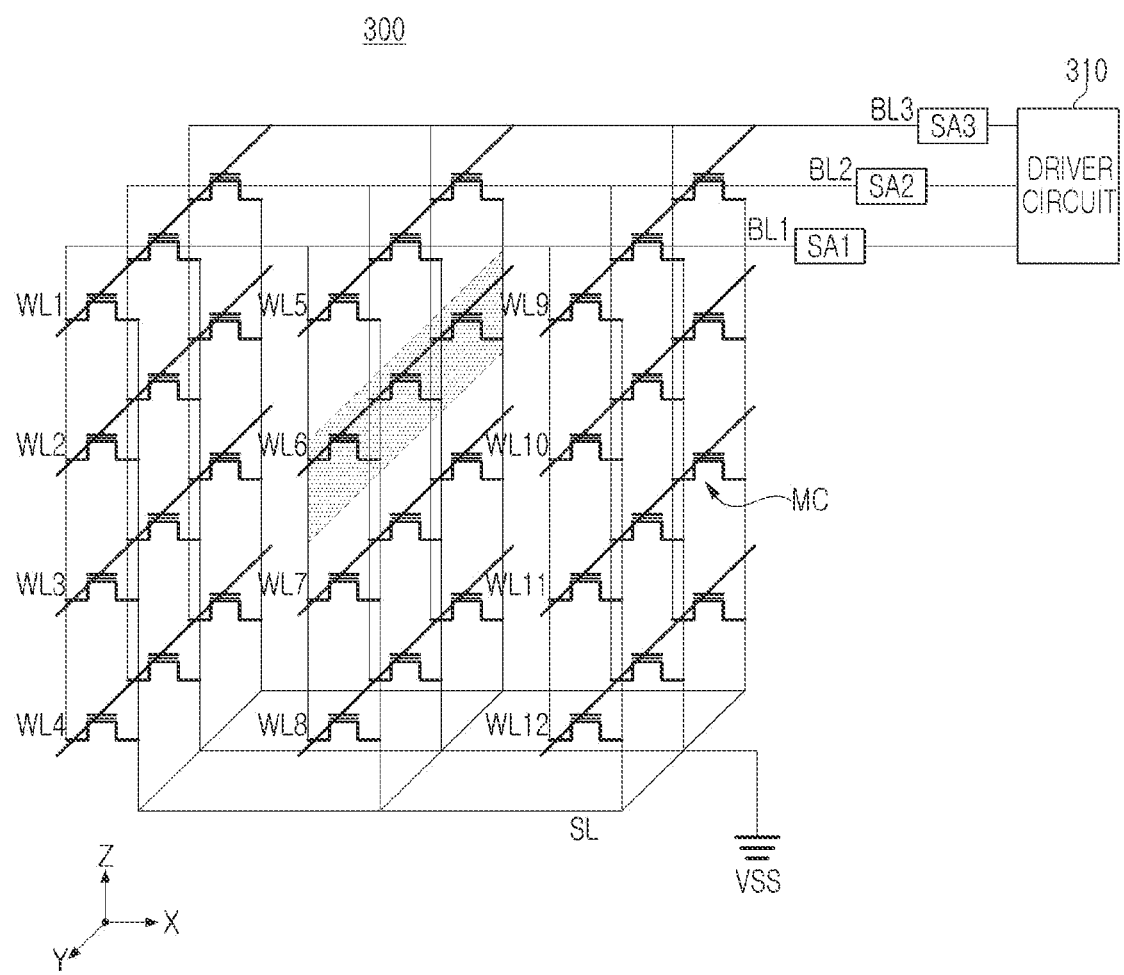
FIGS. 10 to 12 are diagrams illustrating a read operation of a semiconductor device according to an example embodiment of the present inventive concept.
Figure 11:
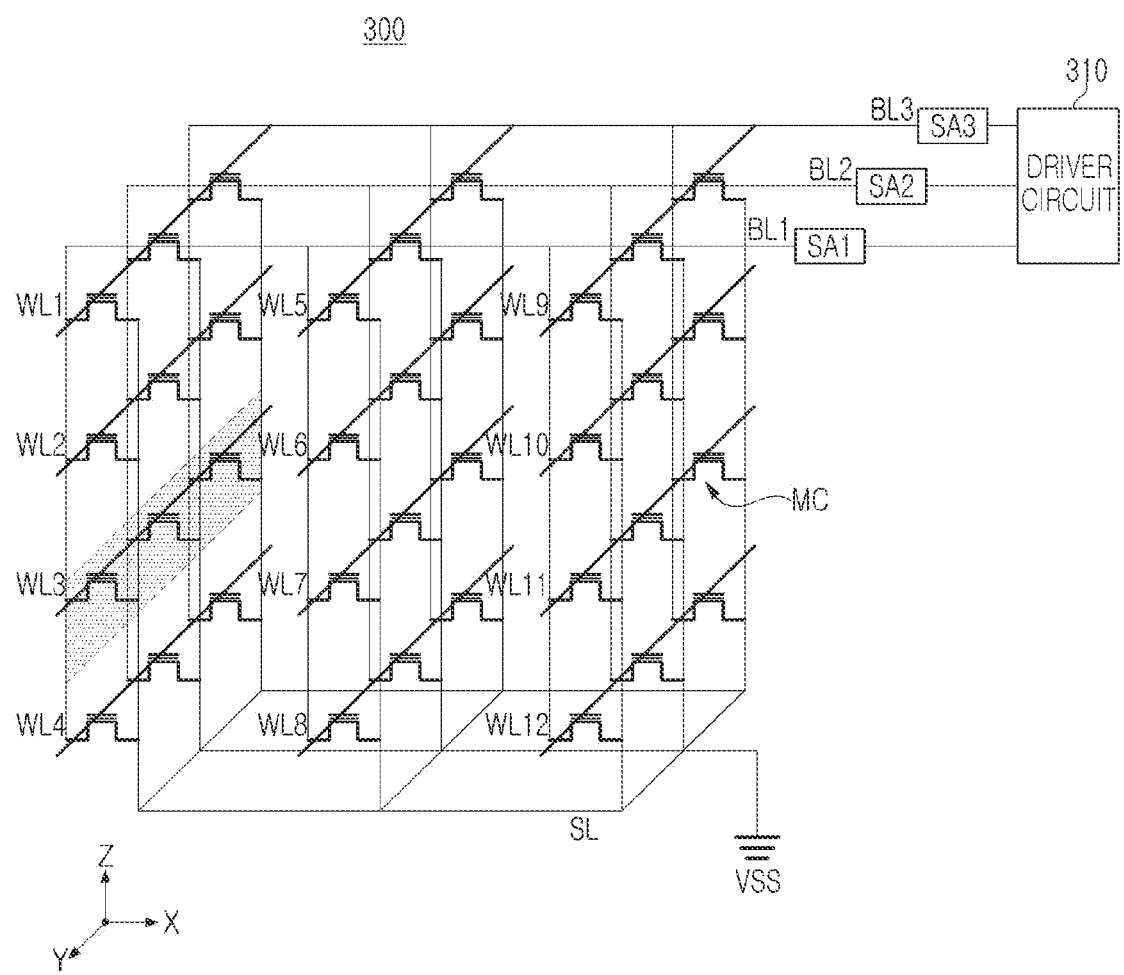
Figure 12:
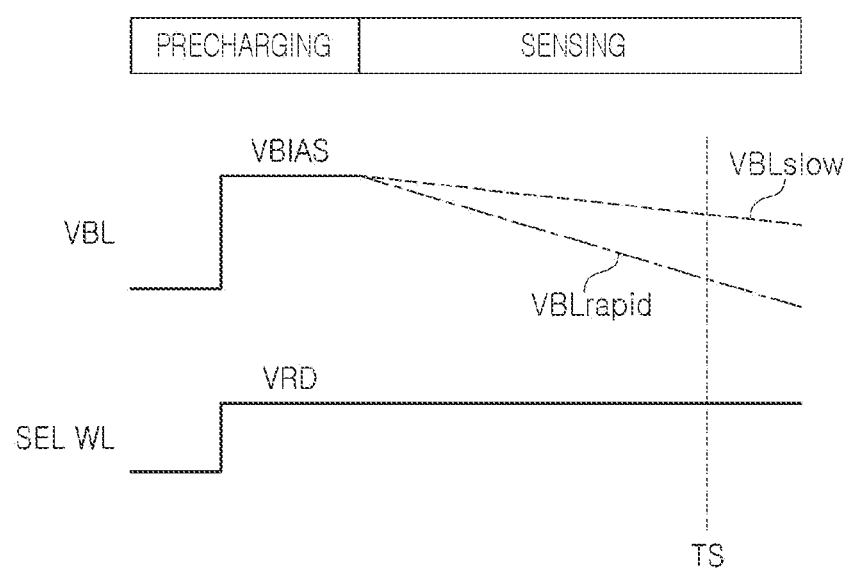

FIGS. 10 to 12 are diagrams illustrating a read operation of a semiconductor device according to an example embodiment of the present inventive concept.

First, referring to FIGS. 10 and 11, a plurality of memory cells MC, included in a semiconductor device 300, may form a memory cell array having the structure described above with reference to FIG. 6. The semiconductor device 300 may include a cell region in which a memory cell array is disposed, and a peripheral circuit region in which a row decoder, a sense amplifier circuit, a driver circuit 310, a control logic, and the like are disposed.

First, in an example embodiment described with reference to FIG. 10, the control logic may determine, as a selected word line, a sixth word line WL6 among a plurality of word lines WL1 to WL12. The control logic may input a predetermined read voltage to the sixth word line WL6, and may input a voltage having a level different from that of the read voltage to the other word lines WL1 to WL5 and WL7 to WL12, unselected word lines. For example, a reference voltage VSS may be input to the unselected word lines such that unselected memory cells, connected to the unselected word lines, are not turned on.

The read voltage may have a level between a threshold voltage of a memory cell in which data "0" is stored and a threshold voltage of a memory cell in which data "1" is stored in a program operation. For example, the read voltage may have a level greater than 0, and each of the memory cells MC may operate as an enhancement-type memory cell.

When the read voltage is input to the sixth word line WL6, a selected word line, the sense amplifier circuit may read data from two or more selected memory cells connected to the sixth word line WL6 via a plurality of bit lines BL1 to BL3. Hereinafter, for ease of description, a selected memory cell connected to a first bit line BL1 and the sixth word line WL6 may be defined as a first selected memory cell, a selected memory cell connected to a second bit line BL2 and the sixth word line WL6 may be defined as a second selected memory cell, and a selected memory cell connected to a third bit line BL3 and the sixth word line WL6 may be defined as a third selected memory cell.

The sense amplifier circuit may include a first sense amplifier SA1 connected to the first bit line BL1, a second sense amplifier SA2 connected to the second bit line BL2, and a third sense amplifier SA3 connected to the third bit line BL3. A predetermined bias voltage may be input to each of the first to third bit lines BL1 to BL3 by the first to third sense amplifiers SA1 to SA3. The first to third sense amplifiers SA1 to SA3 may sense voltage changes of the first to third bit lines BL1 to BL3 while the read voltage is input to the sixth word line WL6 to read data of the first to third selected memory cells. As described above, in an example embodiment of the present inventive concept, data of two or more selected memory cells connected to a selected word line may be read at the same time via the plurality of bit lines BL1 to BL3.

In an example embodiment illustrated in FIG. 11, the control logic may determine a third word line WL3 as a selected word line, and other operations may be similar to those described with reference to FIG. 10. The sense amplifier circuit may input a predetermined bias voltage to the first to third bit lines BL1 to BL3, and may sense a voltage change of each of the first to third bit lines BL1 to BL3 to read data of selected memory cells connected to the third word line WL3. Hereinafter, a read operation according to an example embodiment of the present inventive concept will be described in more detail with reference to FIG. 12.

Referring to FIG. 12, a bit line voltage VBL of each of the first to third bit lines BL1 to BL3 may increase to a bias voltage VBIAS by a precharging operation. In addition, a read voltage VRD may be input to a select word line SEL WL. As described above, the first to third selected memory cells may be connected to the selected word line SEL WL and respectively to the first to third bit lines BL1 to BL3.

In a sensing operation, the bit line voltage VBL of each of the first to third bit lines BL1 to BL3 may decrease. For example, the first bit line BL1 may be connected to the source line SL via the first selected memory cell. Among memory cells connected to the first bit line BL1, all unselected memory cells other than the first selected memory cell may be turned off, and thus, current flowing from the first bit line BL1 to the source line SL may be determined depending on an ON/OFF state of the first selected memory cell receiving the read voltage VRD.

For example, when a threshold voltage of the first selected memory cell is lower than the read voltage VRD, the first selected memory cell may be turned on by the read voltage VRD and a large amount of current may flow to a source line SL from the first bit line BL1. In this case, the bit line voltage VBL of the first bit line BL1 may rapidly decrease (see $VBL_{rapid}$ shown in FIG. 12). Conversely, when the threshold voltage of the first selected memory cell is higher than the read voltage VRD, the first selected memory cell may be turned off by the read voltage VRD and almost no current may flow from the first bit line BL1 to the source line SL. Accordingly, the bit line voltage VBL of the first bit line BL1 may slowly decrease or hardly decrease (see $VBL_{slow}$ shown in FIG. 12).

Referring to FIG. 12, each of the first to third sense amplifiers connected to the first to third bit lines BL1 to BL3 in the sense amplifier circuit may detect the bit line voltage VBL at a sensing point in time TS. When a relatively low bit line voltage VBL is detected at the sensing point in time TS, it may be determined that a threshold voltage of a selected memory cell is lower than the read voltage VRD. Conversely, when a relatively high bit line voltage VBL is detected at the sensing point in time TS, it may be determined that the threshold voltage of the selected memory cell is higher than the read voltage VRD.

As described above, in an example embodiment of the present inventive concept, the sense amplifier circuit may read data of selected memory cells via the bit lines BL1 to BL3 while applying the reference voltage VSS to the source line SL without connecting a driving circuit to the source line SL. Accordingly, the resistance of the source line SL may be reduced by connecting the source line SL to one interconnection pattern, and the semiconductor device 300 may be implemented to have a relatively simple structure.

Figure 13A:
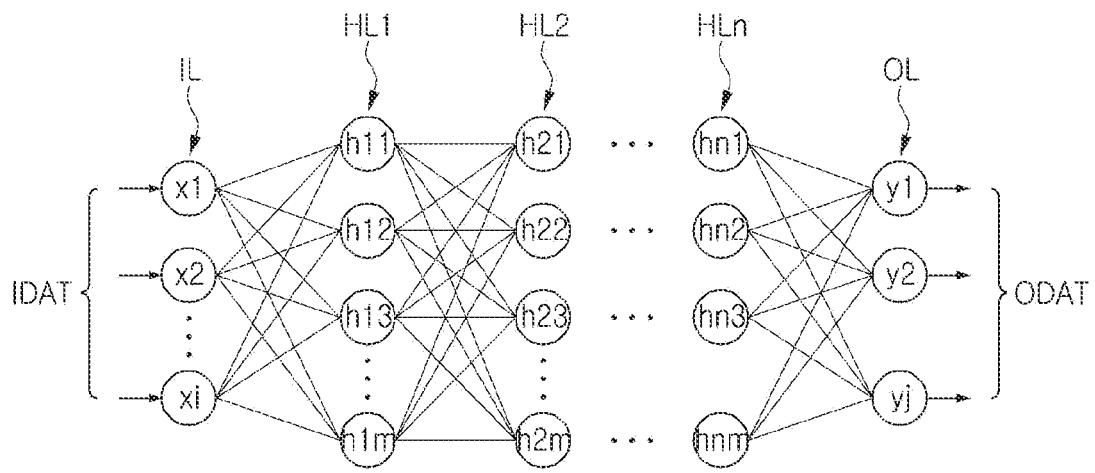
FIGS. 13A and 13B are diagrams illustrating a neural network implemented with a semiconductor device according to an example embodiment of the present inventive concept.
Figure 13B:
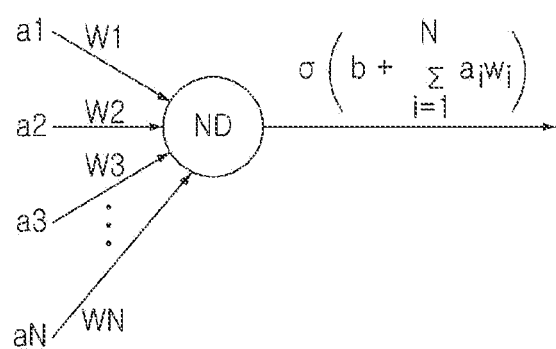

FIGS. 13A and 13B are diagrams illustrating a neural network implemented with a semiconductor device according to an example embodiment of the present inventive concept.

A semiconductor device according to an example embodiment of the present inventive concept may execute a MAC operation required to implement a neural network by controlling a read operation in a different manner. FIGS. 13A and 13B may be diagrams illustrating a neural network that may be implemented with a semiconductor device according to an example embodiment of the present inventive concept.

First, referring to FIG. 13A, a network structure of a general neural network may include an input layer IL, a plurality of hidden layers HL1 to HLn, and an output layer OL. The input layer IL may include i (i is a natural number) input nodes x1 to xi, and vector-type input data IDAT having a length of i may be input to each input node.

The input data IDAT may be input to a hidden layer including n (n is a natural number) hidden layers HL1 to HLn, and each of the hidden layers HL1 to HLn may include hidden nodes. For example, a first hidden layer HL1 may include m (m is a natural number) hidden nodes h11 to hlm, and an n-th hidden layer HLn may include m hidden nodes hn1 to hnm.

In an example embodiment illustrated in FIG. 13A, it is illustrated that each of the hidden layers HL1 to HLn includes the same number of hidden nodes, but the invention is not necessarily limited thereto. For example, at least a portion of the hidden layers HL1 to HLn may include different numbers of hidden nodes.

The output layer OL may include j (j is a natural number) output nodes y1 to yj corresponding to a class to be classified. For example, the output layer OL may output a result (for example, a score or a class score) for each class as output data ODAT with respect to the input data IDAT.

The neural network illustrated in FIG. 13A may include a branch between two nodes illustrated as a straight line and a weight used in each branch. In this case, nodes included in one layer may not be connected to other nodes in the same layer, and nodes included in different layers may be entirely or partially connected to each other.

Each node of FIG. 13A may receive an output of a previous node to execute an arithmetic operation, and may output a result of executing the arithmetic operation to a subsequent node. In this case, each node may calculate a value to be output by applying an input value to a specific function, for example, a nonlinear function.

In general, a structure of a neural network may be predetermined, and weights according to branches between nodes may be determined as appropriate values using a data set having known correct answers. The data set having known correct answers used to determine weights may be referred to as learning data, and a process of determining a weight using the learning data may be referred to as learning.

FIG. 13B may be a diagram illustrating an example embodiment of an arithmetic operation executed on one node ND among nodes included in the neural network of FIG. 13A. Referring to FIG. 13B, when n inputs a1 to aN are provided to the one node ND, the node ND may respectively multiply the n inputs a1 to aN by corresponding n weights w1 to wN, may sum values obtained by the multiplications, and may add an offset b to a value obtained by summing the values. In addition, the node ND may generate one output value z by applying a value, to which an offset is reflected, to a specific function σ.

When one layer among layers, included in the neural network according to an example embodiment illustrated in FIG. 13A, includes m nodes ND illustrated in FIG. 13B, output values of the one layer may be obtained as in [Equation 1].

$$Z = W*A \qquad \text{[Equation 1]}$$

In [Equation 1] above, "W" may represent a weight corresponding to all branches included in the one layer, and may be implemented in the form of an m×n matrix. "A" may represent n inputs a1 to aN received by the one layer, and may be implemented in the form of an n×1 matrix. "Z" may represent m outputs Z1 to Zm output from the one layer, and may be implemented in the form of an m×1 matrix. For example, each row of the matrix "W" may represent a respective node ND of the one layer.

Figure 14:
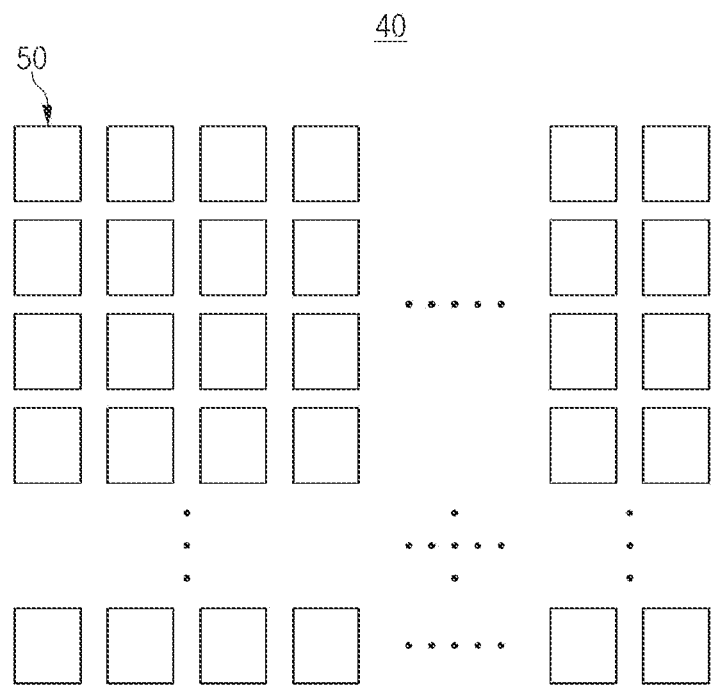
FIG. 14 is a schematic diagram illustrating a semiconductor device according to an example embodiment of the present inventive concept.

FIG. 14 is a schematic diagram illustrating a semiconductor device according to an example embodiment of the present inventive concept.

Referring to FIG. 14, a semiconductor device 40 according to an example embodiment may include a plurality of tiles 50. Each of the plurality of tiles 50 may include a cell region in which a plurality of memory cells are disposed, and in which a peripheral circuit region in which peripheral circuits controlling the plurality of memory cells to execute an arithmetic operation based on a neural network are disposed. In a cell region of each of the plurality of tiles 50, the plurality of memory cells may be disposed in the form of an array to form a memory cell array. For example, each of the plurality of tiles 50 may include the cell region 20, the row decoder 31, the sense amplifier circuit 32, and the like, among components of the semiconductor device 10 described above with reference to FIG. 1.

Weights, assigned to a branch path between a plurality of layers of the neural network, may be stored in the plurality of memory cells in each of the plurality of tiles 50. For example, the weights may be quantized and stored in the plurality of memory cells.

In an example embodiment, weights, included in one layer among a plurality of layers included in the neural network, may be distributed and stored in two or more tiles 50. The two or more tiles 50, each storing a portion of the weights included in the one layer, may be disposed to be adjacent to each other within the semiconductor device 40.

Figure 15:
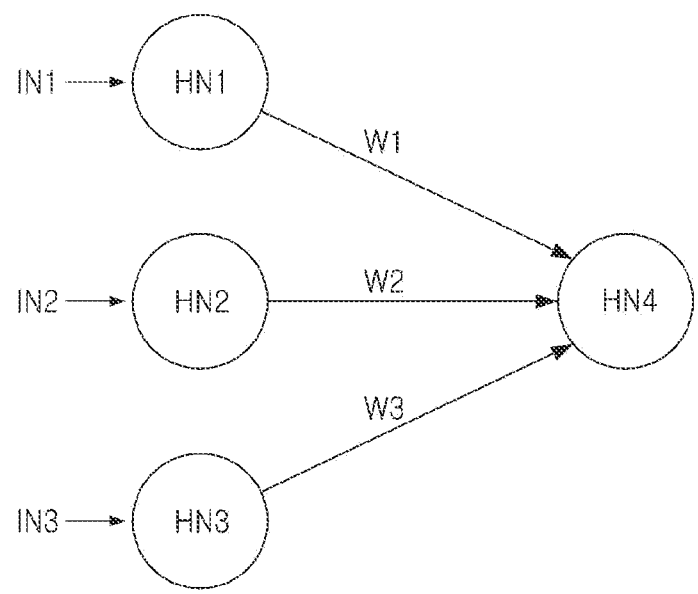
FIGS. 15 and 16 are diagrams illustrating an arithmetic operation using a semiconductor device according to an example embodiment of the present inventive concept.
Figure 16:
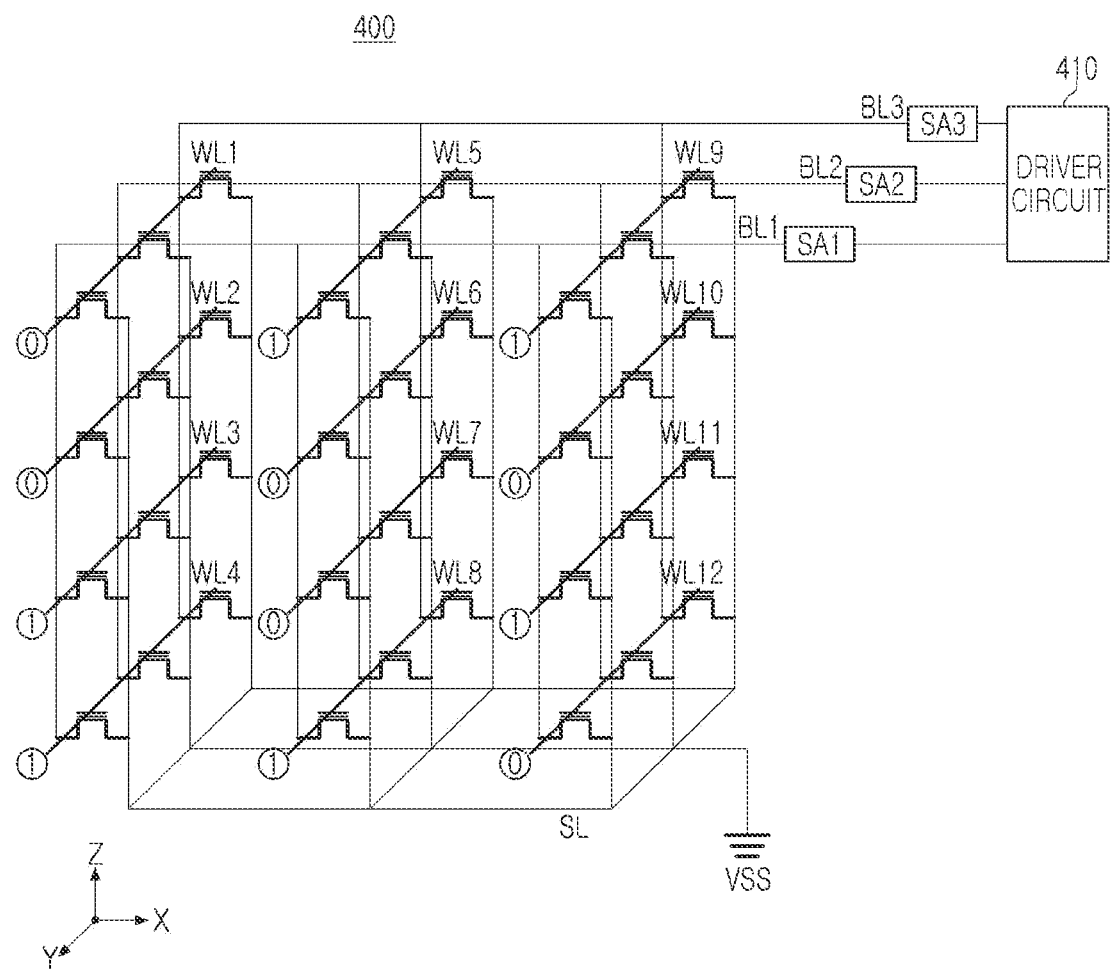

FIGS. 15 and 16 are diagrams illustrating an arithmetic operation using a semiconductor device according to an example embodiment of the present inventive concept.

FIG. 15 may be a diagram illustrating some hidden nodes HN1 to HN4 included in a neural network that may be implemented with a semiconductor device according to an example embodiment of the present inventive concept. First to third input data IN1 to IN3 may be respectively input to the first to third hidden nodes HN1 to HN3. Referring to FIG. 15, a multiplication of first input data IN1 by a first weight W1 may be transmitted to a fourth hidden node HN4, a multiplication of second input data IN2 by a second weight W2 may be transmitted to the fourth hidden node HN4, and a multiplication of third input data IN3 by a third weight W3 may be transmitted to the fourth hidden node HN4. Data received from the first to third hidden nodes HN1 to HN3 may be summed at the fourth hidden node HN4.

An MAC operation, executing such multiplication and addition, may be executed by the semiconductor device according to an example embodiment of the present inventive concept. Hereinafter, the MAC operation will be described in more detail with reference to FIG. 16. In an example embodiment described with reference to FIGS. 15 and 16, each of the first to third input data IN1 to IN3 may be 4-bit data. Each of the first to third weights W1 to W3 may be converted into 3-bit weight data, and the 3-bit weight data may be stored in memory cells MC of a semiconductor device 400. However, the number of bits of the input data IN1 to IN3 and the weight data may vary in some example embodiments.

Referring to FIG. 16, the first input data IN1 may be [0011], the second input data IN2 may be [1001], and the third input data IN3 may be [0010]. It may be assumed that first weight data is [101], second weight data is [011], and third weight data is [111].

First, the first weight data may be stored in memory cells MC connected to first to third bit lines BL1 to BL3 and first to fourth word lines WL1 to WL4. For example, a most significant bit of the first weight data may be stored, in common, in memory cells MC connected to the first bit line BL1 and respectively to the first to fourth word lines WL1 to WL4, and a middle bit of the first weight data may be stored, in common, in memory cells MC connected to the second bit line BL2 and respectively the first to fourth word lines WL1 to WL4. A least significant bit of the first weight data may be stored, in common, in memory cells MC connected to the third bit line BL3 and respectively to the first to fourth word lines WL1 to WL4. For example, data "1" may be stored in each of four memory cells MC connected to the first bit line BL1 and respectively to the first to fourth word lines WL1 to WL4 as a most significant bit of the first weight data.

In the same manner, the second weight data and the third weight data may also be stored. For example, a most significant bit of the second weight data is stored, in common, in memory cells MC connected to the second bit line BL2 and respectively to fifth to eighth word lines WL5 to WL8, and a middle bit of the second weight data may be stored, in common, in the memory cells MC connected to the second bit line BL2 and respectively to the fifth to eighth word lines WL5 to WL8. A least significant bit of the second weight data may be stored, in common, in memory cells MC connected to the third bit line BL3 and respectively to the fifth to eighth word lines WL5 to WL8.

As described above, weight data may be stored, and an input voltage corresponding to each of the first to third input data IN1 to IN3 may be input to a plurality of word lines WL1 to WL12 as illustrated in FIG. 16, thereby simply implementing the MAC operation. For example, in the first bit line BL1, a value obtained by summing a result of executing a multiplication operation between the most significant bit of the first weight data and the first input data IN1, a result of executing a multiplication operation between the most significant bit of the second weight data and the second input data IN2, and a result of executing a multiplication operation between a most significant bit of the third weight data and the third input data IN3 may be output.

In the second bit line BL2, a value obtained by summing a result of executing a multiplication operation between the middle bit of the first weight data and the first input data IN1, a result of executing a multiplication operation between the middle bit of the second weight data and the second input data IN2, and a result of executing a multiplication operation between a middle bit of the third weight data and the third input data IN3 may be output. In the third bit line BL3, a value obtained by summing a result of executing a multiplication operation between the least significant bit of the first weight data and the first input data IN1, a result of executing a multiplication operation between the least significant bit of the second weight data and the second input data IN2, and a result of executing a multiplication operation between a least significant bit of the third weight data and the third input data IN3 may be output.

The semiconductor device 400 may multiply the value obtained in the first bit line BL1 by two digits, multiply the value obtained in the second bit line BL2 by one digit, and add the multiplied values to the value obtained in the third bit line BL3. In such a manner, the MAC operation required to implement the neural network may be simply implemented by the semiconductor device 400.

Figure 17:
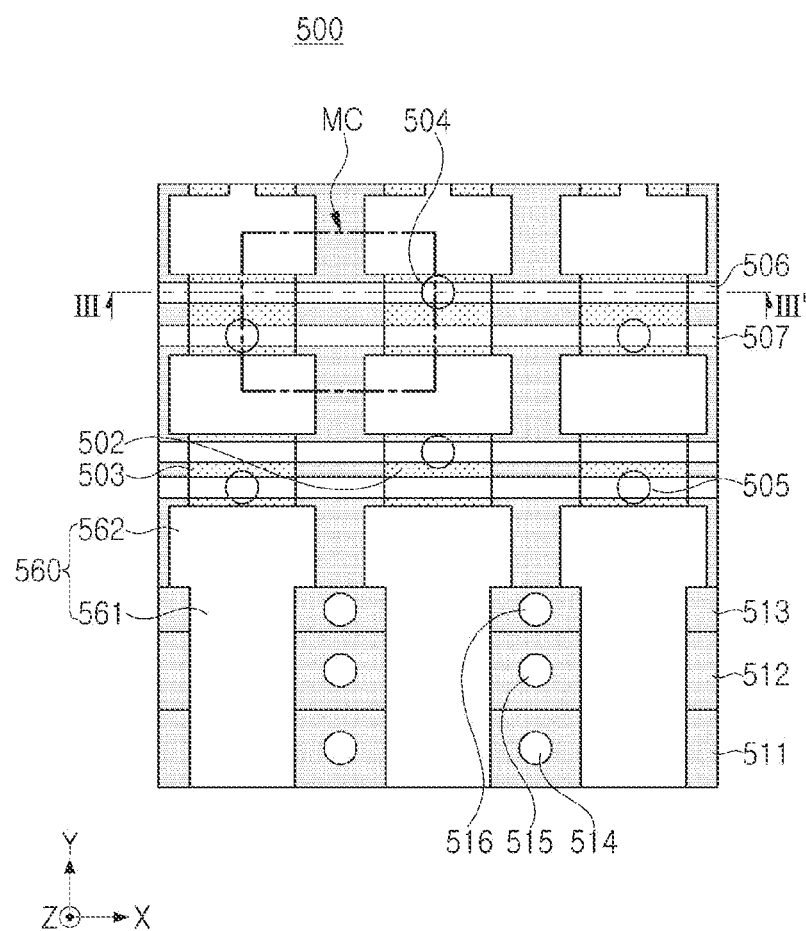
FIGS. 17 and 18 are schematic diagrams illustrating a semiconductor device according to an example embodiment of the present inventive concept.
Figure 18:
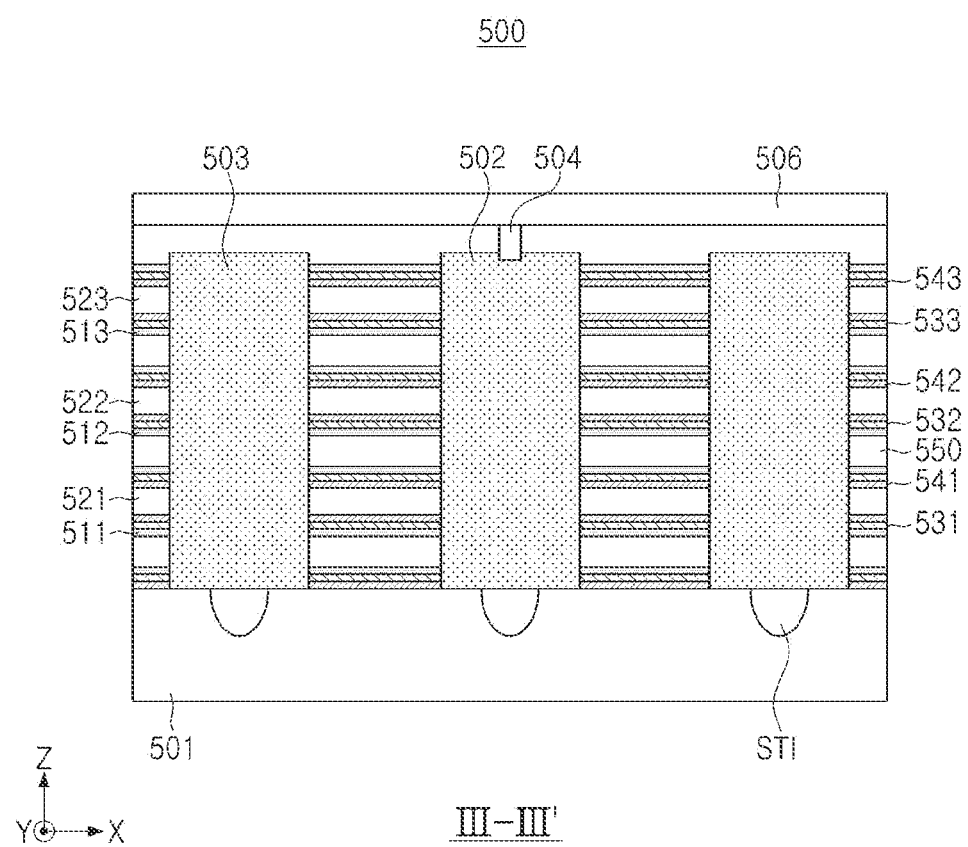

FIGS. 17 and 18 are schematic diagrams illustrating a semiconductor device according to an example embodiment of the present inventive concept.

FIG. 17 may be a schematic plan view illustrating a partial region of the semiconductor device 300 according to an example embodiment of the present inventive concept, and FIG. 18 may be a cross-sectional view of a cross-section in a direction III-III' of FIG. 17. Referring to FIGS. 17 and 18, in a semiconductor device 500 according to an example embodiment of the present inventive concept, a plurality of memory cells may be arranged in a first direction (X-axis direction) and a second direction (Y-axis direction), parallel to an upper surface of a substrate 501.

Each of the plurality of memory cells may include a first active region 502 and a second active region 503 adjacent to each other in the first direction, a plurality of channel layers 521 to 523 extending in the first direction between the first active region 502 and the second active region 503, a plurality of ferroelectric layers 531 to 533 and a plurality of gate electrode layers 511 to 513 sequentially disposed on the plurality of channel layers 521 to 523, and the like. In addition, a plurality of gate insulating layers 541 to 543 may be disposed between the plurality of channel layers 521 to 523 and the plurality of ferroelectric layers 531 to 533.

In a similar manner to the description provided with reference to FIGS. 3 to 5, the gate electrode layers 511 to 513 may provide a plurality of word lines and extend to different lengths in a second direction to be connected to gate contacts 514 to 516. In addition, the channel layers 521 to 523 may be isolated from each other in a third direction (Z-axis direction), perpendicular to the upper surface of the substrate 501. An interlayer insulating layer 550 may be disposed between the channel layers 521 to 523 in the third direction, and each of the gate electrode layers 511 to 513 may be divided into a plurality of regions by a vertical insulating layer 560 in the first direction.

The vertical insulating layer 560 may include a first vertical insulating layer 561, adjacent to the gate contacts 514 to 516 in the first direction, and a second vertical insulating layer 562, disposed between the active regions 502 and 503 in the second direction. The second vertical insulating layer 562 may have a width in the first direction longer than that of the first vertical insulating layer 561 in the first direction.

In an example embodiment described with reference to FIGS. 17 and 18, memory cells, adjacent to each other in the first direction, may share the active regions 502 and 503. For example, referring to FIG. 17, a pair of memory cells MC, adjacent to each other in the first direction, may share one first active region 502. The first active region 502 shared by the pair of memory cells MC may provide a source region connected to source lines 506 via a source line contact 504. The source lines 506 may be electrically connected to each other to receive a reference voltage.

Depending on a position defined on an X-Y plane, the pair of memory cells, adjacent to each other, may share the second active region 503 as a drain region. The second active region 503 may be connected to one of bit lines 507 via a bit line contact 505. The memory cells, sharing one of the active regions 502 and 503, may include gate electrode layers 511 to 513 isolated from each other, regardless of whether the active regions 502 and 503 are shared, such that the memory cells may be controlled independently of each other.

Figure 19:
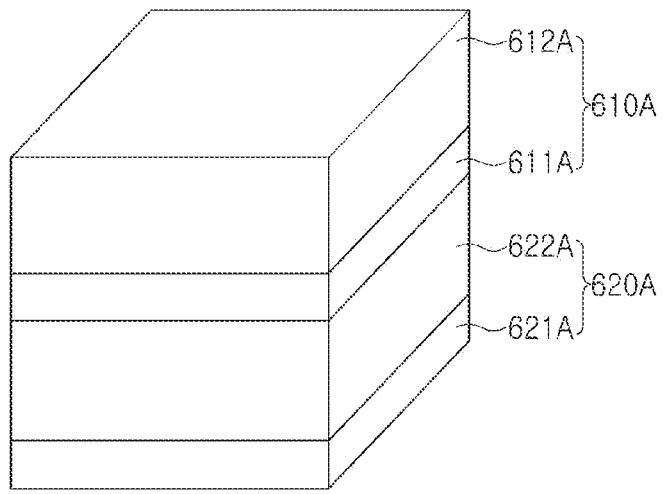
FIGS. 19 to 21 are schematic diagrams illustrating a semiconductor device according to an example embodiment of the present inventive concept.
Figure 20:
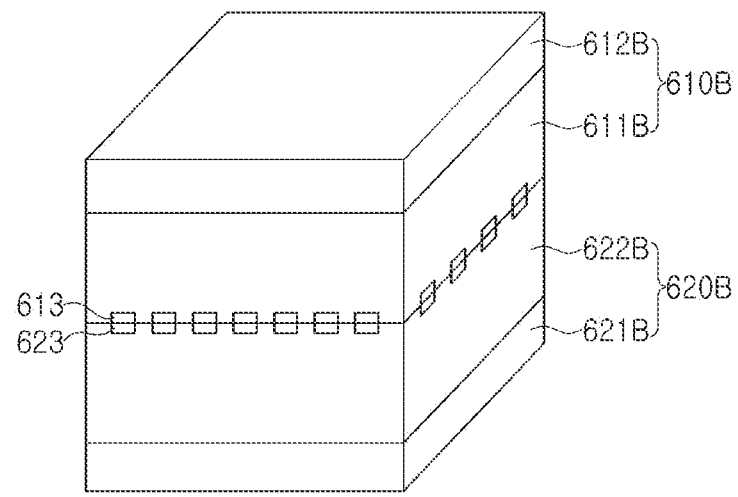
Figure 21:
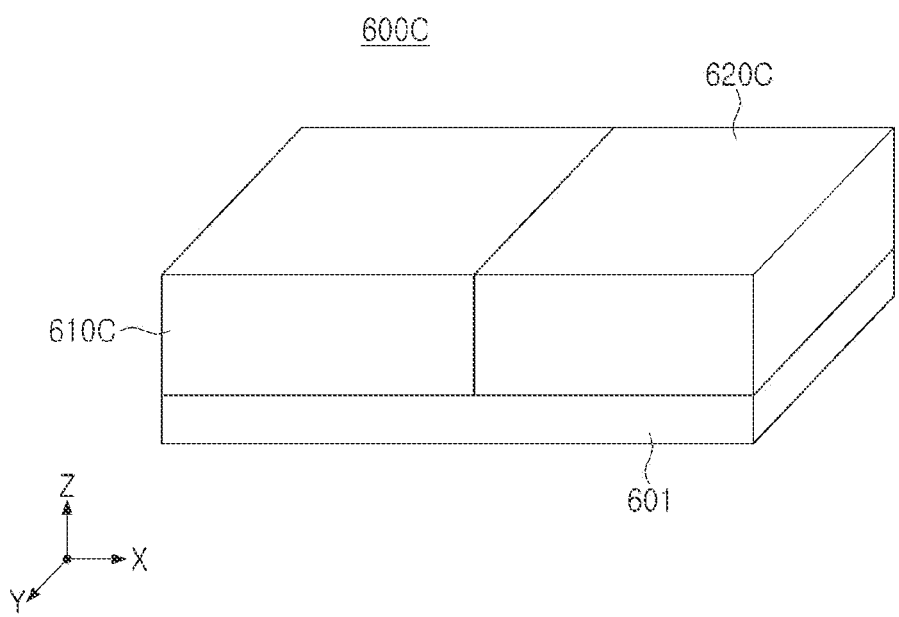

FIGS. 19 to 21 are schematic diagrams illustrating a semiconductor device according to an example embodiment of the present inventive concept.

First, referring to FIG. 19, a semiconductor device 600A may include a cell region 610A and a peripheral circuit region 620A. The cell region 610A may include a first substrate 611A, parallel to a plane defined by a first direction (X-axis direction) and a second direction (Y-axis direction), a cell array region 612A disposed on the first substrate 611A, and the like. For example, a plurality of memory cells may be disposed in the form of a memory cell array in a cell array region 612A.

The peripheral circuit region 620A may include a second substrate 621A and a device region 622A disposed on the second substrate 621A. The device region 622A may include a plurality of devices formed on the second substrate 621A, a plurality of interconnection patterns connecting the plurality of devices to each other, a lower interlayer insulating layer covering the plurality of devices and the plurality of interconnection patterns, and the like. An upper surface of the lower interlayer insulating layer may be in contact with a lower surface of the first substrate 611A.

The cell region 610A and the peripheral circuit region 620A may be stacked on each other in a third direction (Z-axis direction). For example, a plurality of bit lines, a plurality of gate contacts, and a plurality of source lines, connected to the memory cells in the cell region 610A, may be connected to at least a portion of the interconnection patterns of the device region 622A via via structures, passing through the first substrate 611A. For example, the device region 622A may provide a row decoder, a sense amplifier circuit, and the like, and the sense amplifier circuit may be connected to an ADC (analog to digital converter) circuit in some example embodiments. The row decoder may be connected to the plurality of gate contacts, and the sense amplifier circuit may be connected to the plurality of bit lines. The plurality of source lines may be connected to each other in the form of a mesh or the like within the cell region 610A, and may receive a reference voltage VSS from the device region 622A.

Referring to FIG. 20, a semiconductor device 600B may include a cell region 610B and a peripheral circuit region 620B, and the cell region 610B and the peripheral circuit region 620B may be stacked on each other in a third direction (Z-axis direction). The cell region 610B may include a first substrate 611B, a cell array region 612B in which memory cells are disposed, and the like, and the peripheral circuit region 620B may include a device region 622B provided on a second substrate 621B. The device region 622B may include a row decoder, a sense amplifier, and the like.

In an example embodiment illustrated in FIG. 20, upper pads 613, connected to a plurality of bit lines, a plurality of source lines, and a plurality of gate contacts in the cell array region 612B, may be directly connected to lower pads 623, connected to interconnection patterns in the device region 622B. For example, the upper pads 613 and the lower pads 623 may be bonded to each other using a Cu—Cu bonding method, or may be bonded to each other on a chip level or a wafer level.

In an example embodiment illustrated in FIG. 21, in a semiconductor device 600C, both a cell region 610C and a peripheral circuit region 620C may be formed on one substrate 601. FIG. 21 illustrates that the peripheral circuit region 620C is disposed on one side of the cell region 610C in a first direction (X-axis direction). However, in some example embodiments, the arrangement of the cell region 610C and the peripheral circuit region 620C may be modified in various manners. For example, assuming that a plurality of bit lines extend in a first direction and gate electrode layers extend in a second direction (Y-axis direction), a sense amplifier circuit and the like, among circuits included in the peripheral circuit region 620C, may be disposed in a region, adjacent to the cell region 610C in the first direction. A row decoder, connected to the gate electrode layers, may be disposed in a region, adjacent to the cell region 610C in the second direction.

According to an example embodiment of the present inventive concept, a program operation for a plurality of selected memory cells may be executed in parallel at the same time by inputting one of a positive voltage and a negative voltage to a word line, thereby minimizing disturbance in the program operation. In addition, one of active regions of the plurality of memory cells may be connected to a source line to which a reference voltage is input in common, thereby implementing a semiconductor device having a simple structure. In addition, the semiconductor device may operate as a general memory device capable of programming and reading data and effectively execute an arithmetic operation based on a neural network.

The various and beneficial advantages and effects of the present inventive concept are not limited to those set forth herein, and will be more easily understood in the course of describing specific example embodiments of the present inventive concept.

While example embodiments have been illustrated and described above, it will be apparent to those skilled in the art that modifications and variations could be made without departing from the scope of the present inventive concept as defined by the appended claims.

What is claimed is:

1. A semiconductor device comprising:
   a cell region in which a plurality of memory cells are disposed in a first direction and a second direction, the first direction and the second direction being parallel to an upper surface of a substrate and intersecting each other, wherein each of the plurality of memory cells comprises:
   a first active region and a second active region arranged in the first direction,
   a channel layer connected to the first active region and the second active region, and
   a ferroelectric layer and a gate electrode layer surrounding the channel layer; and
   a peripheral circuit region in which are disposed:
   a plurality of sense amplifiers connected to the plurality of memory cells via a plurality of bit lines,
   a row decoder connected to the plurality of memory cells via a plurality of word lines, and
   a control logic controlling the plurality of sense amplifiers and the row decoder,
   wherein, in two or more memory cells stacked in a third direction perpendicular to the upper surface of the substrate, the first active regions of the two or more memory cells are connected to each other and the second active regions of the two or more memory cells are connected to each other, and
   the first active region in each of the plurality of memory cells receives a reference voltage in common with each other of the plurality of memory cells,
   the second active region in each of the plurality of memory cells is connected to one of the plurality of bit lines, and
   the gate electrode layer in each of the plurality of memory cells is connected to one of the plurality of word lines.

2. The semiconductor device of claim 1, wherein the channel layer, the ferroelectric layer, and the gate electrode layer of each of the two or more memory cells are isolated from the channel layer, the ferroelectric layer, and the gate electrode layer of each other of the two or more memory cells.

3. The semiconductor device of claim 1, wherein
when a program operation for at least one selected memory cell, among the plurality of memory cells, is executed, a sense amplifier from among the plurality of sense amplifiers that is connected to a selected bit line connected to the selected memory cell inputs a predetermined level of selected voltage to the selected bit line, and the other sense amplifiers from among the plurality of sense amplifiers input the reference voltage to unselected bit lines different from the selected bit line, and
the row decoder inputs a first program voltage or a second program voltage to a selected word line connected to the selected memory cell.

4. The semiconductor device of claim 3, wherein the first program voltage is a negative voltage, and the second program voltage is a positive voltage.

5. The semiconductor device of claim 4, wherein an absolute value of the first program voltage is equal to an absolute value of the second program voltage.

6. The semiconductor device of claim 1, wherein
the plurality of memory cells store weight data corresponding to weight values of a neural network having a plurality of layers,
the plurality of sense amplifiers input a predetermined bias voltage to each of the plurality of bit lines, and
the row decoder inputs, to the plurality of word lines, input voltages corresponding to input data for one layer among the plurality of layers.

7. The semiconductor device of claim 6, wherein
each of the plurality of sense amplifiers senses an amount of voltage change of a bias voltage on a respective one of the plurality of bit lines, the amount of voltage change depending on an amount of current flowing between the respective bit line and a source line, the source line being connected to the first active region of each of the plurality of memory cells, and
the control logic determines, based on the amount of voltage change, a result of executing a multiply-accumulate (MAC) operation on the one layer.

8. The semiconductor device of claim 1, wherein
the row decoder inputs a read voltage to one selected word line among the plurality of word lines,
the plurality of sense amplifiers input a predetermined bias voltage to each of the plurality of bit lines,
each of the plurality of sense amplifiers senses an amount of voltage change of a bias voltage on a respective one of the plurality of bit lines, the amount of voltage change depending on an amount of current flowing between the respective bit line and a source line, the source line being connected to the first active region of each of the plurality of memory cells, and
the control logic determines, based on the amount of voltage change, data stored in each of selected memory cells connected to the selected word line.

9. The semiconductor device of claim 8, wherein a level of the read voltage is higher than a level of the reference voltage.

10. The semiconductor device of claim 1, wherein a level of the reference voltage is a ground level.

11. The semiconductor device of claim 1, wherein
among the plurality of memory cells, the second active regions of memory cells disposed at the same position in the second direction are connected in common to one of the plurality of bit lines, and
among the plurality of memory cells, the gate electrode layers of memory cells disposed at the same height in the third direction from the upper surface of the substrate are connected in common to one of the plurality of word lines.

12. The semiconductor device of claim 11, wherein the semiconductor device further comprises a first gate electrode layer disposed at a first height from the upper surface of the substrate and a second gate electrode layer disposed at a second height higher than the first height, and
a length of the first gate electrode layer is longer than a length of the second gate electrode layer, in the second direction.

13. A semiconductor device comprising:
a plurality of memory cells connected to a plurality of word lines, a plurality of bit lines, and one source line;
a row decoder connected to the plurality of word lines; and
a sense amplifier circuit connected to the plurality of bit lines,
wherein, in a program operation for two or more selected memory cells among the plurality of memory cells, a reference voltage is applied to the one source line, the sense amplifier circuit inputs a selected voltage to one selected bit line connected to all of the two or more selected memory cells, and the row decoder inputs, to selected word lines connected to respective ones of the two or more selected memory cells, a first program voltage lower than the reference voltage or a second program voltage higher than the reference voltage, and
each of the plurality of memory cells comprises a ferroelectric layer in which at least one of a polarization direction and a polarization degree changes depending on a voltage input to each of the plurality of word lines.

14. The semiconductor device of claim 13, wherein each of the two or more selected memory cells is programmed in parallel at the same time by a voltage input to each of the selected word lines.

15. The semiconductor device of claim 13, wherein
each of the plurality of memory cells comprises a first active region connected to the source line, a second active region connected to one of the plurality of bit lines, a channel layer connected to the first active region and the second active region, and a gate electrode layer surrounding the channel layer and connected to one of the plurality of word lines, and
the ferroelectric layer is disposed between the channel layer and the gate electrode layer.

16. The semiconductor device of claim 15, wherein
some selected memory cells, among the two or more selected memory cells, share the first active region and the second active region, and
some selected word lines, among the selected word lines, connected to the some selected memory cells are isolated from each other.

17. The semiconductor device of claim 13, wherein, among the two or more selected memory cells, first data is stored in at least one first selected memory cell to which the first program voltage is input, and second data is stored in at least one second selected memory cell to which the second program voltage is input.

18. The semiconductor device of claim 13, wherein the number of the selected memory cells is equal to the number of the selected word lines.

19. A semiconductor device comprising:
a plurality of memory cells connected to a plurality of word lines, a plurality of bit lines, and one source line;
a row decoder connected to the plurality of word lines;
a sense amplifier circuit connected to the plurality of bit lines; and
a control logic configured to control the row decoder and the sense amplifier circuit,
wherein, in a read operation for two or more selected memory cells among the plurality of memory cells, a reference voltage is applied to the source line, the sense amplifier circuit inputs a predetermined bias voltage to selected bit lines connected to all of the two or more selected memory cells, and the row decoder inputs a read voltage higher than the reference voltage to at least one selected word line connected to the two or more selected memory cells,
the control logic executes the read operation based on a voltage change of each of the selected bit lines sensed by the sense amplifier circuit, and
each of the plurality of memory cells comprises a ferroelectric layer in which at least one of a polarization direction and a polarization degree changes depending on a voltage input to each of the plurality of word lines.

20. The semiconductor device of claim 19, wherein the number of the at least one selected word line is one, and
the control logic determines data of each of the two or more selected memory cells connected to the selected word line.

* * * * *